US010700136B2

(12) United States Patent
Qiu et al.

(10) Patent No.: US 10,700,136 B2
(45) Date of Patent: Jun. 30, 2020

(54) PIXEL STRUCTURE AND ORGANIC LIGHT EMITTING DISPLAY USING THE PIXEL STRUCTURE

(71) Applicants: Kunshan Go-Visionox Opto-Electronics Co., Ltd., Jiangsu (CN); Kunshan New Flat Panel Display Technology Center Co., Ltd., Jiangsu (CN)

(72) Inventors: Yong Qiu, Beijing (CN); Zhouying Liu, Jiangsu (CN); Xiuqi Huang, Jiangsu (CN); Shenfu Zhang, Jiangsu (CN); Min Liu, Jiangsu (CN); Chao Chi Peng, Jiangsu (CN); Lin He, Jiangsu (CN); Hui Zhu, Jiangsu (CN); Hong Chen, Jiangsu (CN); Honglei Luo, Jiangsu (CN)

(73) Assignees: Kunshan New Flat Panel Display Technology Center Co., Ltd. (CN); Kunshan Go-Visionox Opto-Electronics Co., Ltd. (CN)

(*) Notice: Subject to any disclaimer, the term of this patent is extended or adjusted under 35 U.S.C. 154(b) by 177 days.

(21) Appl. No.: 15/109,007

(22) PCT Filed: Dec. 31, 2014

(86) PCT No.: PCT/CN2014/095871
§ 371 (c)(1),
(2) Date: Jun. 29, 2016

(87) PCT Pub. No.: WO2015/101328
PCT Pub. Date: Jul. 9, 2015

(65) Prior Publication Data
US 2016/0329385 A1 Nov. 10, 2016

(30) Foreign Application Priority Data
Dec. 31, 2013 (CN) .......................... 2013 1 0747572

(51) Int. Cl.
H01L 27/32 (2006.01)

(52) U.S. Cl.
CPC ...... *H01L 27/3218* (2013.01); *H01L 27/3216* (2013.01); *H01L 27/3213* (2013.01)

(58) Field of Classification Search
CPC ............ H01L 27/3218; H01L 27/3216; H01L 27/3213
See application file for complete search history.

(56) References Cited

U.S. PATENT DOCUMENTS

2005/0162079 A1  7/2005  Sakamoto
2005/0270444 A1  12/2005  Miller et al.
(Continued)

FOREIGN PATENT DOCUMENTS

CN   101449382 A   6/2009
CN   202285072 U   6/2012
(Continued)

OTHER PUBLICATIONS

European Seach Report for Application No. 14877098.5 dated Jun. 22, 2017, 2 pages.
(Continued)

*Primary Examiner* — Vongsavanh Sengdara
(74) *Attorney, Agent, or Firm* — Lerner, David, Littenberg, Krumholz & Mentlik, LLP

(57) ABSTRACT

A pixel structure and an organic light emitting display are disclosed. The pixel structure includes a plurality of pixels which includes a plurality of sub-pixels. At least one pixel forms a pixel unit, and longitudinally adjacent pixel units are arranged in a vertical mirror image, and/or laterally adjacent pixel units are arranged in a horizontal mirror image. The present disclosure may increase the area of mask opening during evaporation, reduce the difficulty of mask production process, and reduce the evaporation process difficulty by a (Continued)

reasonable pixel arrangement structure and allowing sub-pixels of adjacent pixels to share one mask opening to evaporate. It does not need to preset a gap during evaporating the sub-pixels of adjacent pixels of the mask, thereby a real high PPI is achieved while keeping the opening ratio. In addition, the present disclosure can further increase the strength of the mask.

4 Claims, 17 Drawing Sheets

(56) References Cited

U.S. PATENT DOCUMENTS

| | | | |
|---|---|---|---|
| 2006/0028495 A1 | 2/2006 | Phan | |
| 2006/0033422 A1 | 2/2006 | Chao et al. | |
| 2007/0176950 A1 | 8/2007 | Brown et al. | |
| 2008/0299496 A1 | 12/2008 | Hirakata et al. | |
| 2009/0121983 A1 | 5/2009 | Sung et al. | |
| 2009/0302331 A1 | 12/2009 | Smith et al. | |
| 2010/0053043 A1* | 3/2010 | Sakamoto | H01L 27/3213 345/77 |
| 2011/0025723 A1* | 2/2011 | Kim | H01L 27/3218 345/690 |
| 2011/0050645 A1* | 3/2011 | Lee | G06F 3/042 345/175 |
| 2011/0128262 A1 | 6/2011 | Chaji et al. | |
| 2012/0295508 A1 | 11/2012 | Sung et al. | |

FOREIGN PATENT DOCUMENTS

| | | |
|---|---|---|
| CN | 102830450 A | 12/2012 |
| CN | 102830451 A | 12/2012 |
| CN | 203165952 U | 8/2013 |
| CN | 104009066 A | 8/2014 |
| CN | 104037197 A | 9/2014 |
| CN | 104037198 A | 9/2014 |
| CN | 104037199 A | 9/2014 |
| CN | 104037200 A | 9/2014 |
| JP | 2009533810 A | 9/2009 |
| JP | 2011096378 A | 5/2011 |
| JP | 2013058323 A | 3/2013 |
| KR | 20110013691 A | 2/2011 |
| KR | 20120041510 A | 5/2012 |

OTHER PUBLICATIONS

Chinese Search Report for Application No. 201310747572.1 dated Mar. 25, 2017, 1 page.
Notice of Final Rejection in Korean Patent Application No. 10-2016-702077, dated Feb. 27, 2018.
Reasons of Refusal for Japanese Patent Application No. 2016-543193 dated Jan. 23, 2018.
Reasons of Refusal for Japanese Patent Application No. 2016-543193 dated Apr. 28, 2017.
First Office Action for Priority Chinese Patent Application No. 201310747572.1 dated Apr. 5, 2017.
Extended European Search Report including Written Opinion of EP14877098.5 dated Jun. 22, 2017.
First Office Action of Korean Patent Application No. 10-2016-7020777 dated Aug. 21, 2017.
Written Opinion for PCT/CN2014/095871 dated Mar. 18, 2015.
International Search Report for Application No. PCT/CN2014/095871 dated Mar. 18, 2015.
Search Report of Taiwan Patent Application No. 103146443, dated Aug. 19, 2019.
EP Examination Report for Application 14 877 098.5-1211 dated Jul. 16, 2019.

* cited by examiner

PIXEL STRUCTURE AND ORGANIC LIGHT EMITTING DISPLAY USING THE PIXEL STRUCTURE

CROSS-REFERENCE TO RELATED APPLICATIONS

The present application is a national phase entry under 35 U.S.C § 371 of International Application No. PCT/CN2014/095871 filed Dec. 31, 2014, published in Chinese, which claims the benefit of Chinese Application No. 201310747572.1 filed Dec. 31, 2013, all of which are hereby incorporated herein by reference.

The present disclosure relates to the technical field of organic light emitting display, and more particularly, to a pixel structure and an organic light emitting display using the pixel structure.

BACKGROUND

OLED (Organic Light-Emitting Diode) is active light emitting device. Compared with traditional LCD (Liquid Crystal Display) display, OLED display technology does not need backlight, which has a property of active light emitting. OLED uses a very thin layer of organic material and a glass substrate, and when a current is passed, the organic material will emit light. Therefore, the OLED display can significantly save energy, and can be made thinner and lighter, meanwhile withstanding a wider range of temperature changes than the LCD display, with a lager viewing angle. The OLED display is expected to become the next generation flat panel display technology after the LCD, and it is currently one of the most concerns in the flat panel display technology.

There are many methods for coloring OLED screen body. Currently, an OLED coloring technology which is more mature and has successful production is OLED evaporation technology which uses a traditional RGB stripe arrangement to evaporate. A side-by-side arrangement has the best picture effect. The side-by-side arrangement refers to an arrangement in which there are three sub-pixels in one pixel range: the red (R), green (G), and blue (B) sub-pixels. Each of the sub-pixels is a quadrilateral, and has an independent organic light emitting device. The organic light emitting device is formed on a corresponding pixel position on array substrate through fine metal mask (FMM) by evaporation coating film technology. The technical key of production of OLED screen body with high PPI (pixel per inch) is that the fine metal mask is fine and has good mechanical stability, and the key of the fine metal mask is an arrangement of the pixel and sub-pixel.

At present, in the art there are many arrangements such as slit, slot, pentile and IGNIS etc. However, the above arrangements can not well solve the problem of improving pixel density, for area of a mask opening has lower specification limit. Moreover, in order to avoid influence by tolerance during production process, there is a need to preset a gap between the openings for adjacent pixels, which makes it difficult for pixel density, e.g. PPI to be significantly improved, and pixel arrangement is not a real sense of the true color display and other reasons.

In the traditional pixel arrangement, each of the pixels is respectively composed of R, G, B three colors. In the pixel arrangement as shown in FIG. 1, one pixel is divided into R, G, B three parallel sub-pixels, and each of the sub-pixels is a quadrilateral. Size of the quadrilateral corresponding to the R, G, B sub-pixels is adjusted according to the property of corresponding RGB device. As shown in FIG. 1, a pixel region 100 includes an R sub-pixel region 101, an R light emitting region 102, a G sub-pixel region 103, a G light emitting region 104, a B sub-pixel region 105, and a B light emitting region 106. As illustrated, the area of the R, G, B sub-pixel regions is equal to that of the R, G, B light emitting regions, and the area can be adjusted as needed during implementation.

FIG. 1A and FIG. 1B respectively correspond to two evaporation masks of FIG. 1. Wherein, 107, 109 in FIG. 1A and FIG. 1B are mask occlusion area, evaporated region opening 108, 110 may be a slit or a slot.

FIG. 1A is a slit-type evaporation mask, and size of the corresponding metal mask opening corresponds to the size of the sub-pixel. A main characteristic of the opening type of the metal mask is that all the sub-pixels in the same column in the screen body share the same opening; the metal mask opening is longer in a length direction; with the display size increasing, the length of the metal mask opening also need to increase; and non-opening portions between adjacent openings forms a metal stripe.

For OLED screen body with low PPI, the slit-type opening makes spacing of the adjacent metal mask opening lager, the metal stripe wider, and the production and use of the metal mask easier. However, when the slit-type opening is applied into the OLED screen body with high PPI, the spacing between the adjacent fine metal mask opening becomes smaller, the metal stripe is thinner, and during use of the metal mask, the metal stripe is easy to deform under influence of direction of the magnetic induction line of magnet plate, resulting in different color materials of sub-pixels polluting with each other and color mixing, further leading to lower production yield. In addition, this kind of metal mask is also easily damaged deformed during use, cleaning, and storage process, therefore its recycling rate is not high. For higher cost of the metal mask, the cost of the screen body produced in this way is also higher.

FIG. 1B is a slot-type evaporation mask. A main characteristic of the opening type of the metal mask is that a bridge is added between pixels in the slit opening, in order to connect adjacent metal stripes, changing original one long opening to a plurality of opening units. This method makes the metal stripe of the metal mask more stable, solving the problem that the metal stripe with slit-type opening is easy to deform under influence of direction of the magnetic induction line of magnet plate. However, considering the long size precision of the metal mask, in order to avoid producing shadow effect to the sub-pixel during evaporation, enough distance must be kept between the sub-pixel and the bridge, leading to upper and lower length of the sub-pixels reduced, thereby impacting opening ratio of each sub-pixel.

In the above means, each opening in the mask can only correspond to one sub-pixel with the same color, of which the arrangement density can not be increased, and therefore the resolution can not be improved. Under affected by the technology level of mask, the opening in the mask can not be too small. Since the evaporation will produce "shadow effect", a certain margin needs to be preset between two light emitting regions, to prevent the "shadow effect" from arising color mixing, therefore the mask opening can not be produced too small, otherwise will effect the opening ratio.

In the US patent application with publication number US20110128262 by Canada IGNIS company, an arrangement of pixel array is disclosed. However, each of the sub-pixels thereof is still quadrilateral, only the relative position relationship between the sub-pixels is different from the slit and slot arrangements, and the arrangement of three sub-pixels is shown in FIG. 2. A pixel region 200 includes an R sub-pixel region 201, an R light emitting region 202, a G sub-pixel region 203, a G light emitting region 204, a B sub-pixel region 205, and a B light emitting region 206. FIG. 2A and FIG. 2B respectively corresponds to two evaporation masks for the B sub-pixel shown in FIG. 2, and FIG. 2C corresponds to the evaporation mask for the R sub-pixel or the G sub-pixel. The mask opening is equivalent to dividing one pixel into two sub-pixels, and shadow regions 207, 209 and 211 as shown are respectively evaporated occlusion regions. Evaporated openings 208 and 210 for evaporating the B sub-pixel may be silt or slot, evaporated opening 212 is the mask opening for the R or G sub-pixel, and the evaporated opening still corresponds to one sub-pixel, that is, its length and width dimensions is equivalent to length and width dimensions of one sub-pixel. In this way, periodically horizontal and vertical translation of the pixel forms pixel array of rows and columns. The spacing between the metal mask openings corresponding to the red and green sub-pixels is relatively large, which can achieve high PPI display to some extent.

Pixels arranged periodically cause blue sub-pixels in the pixel array form a linear arrangement, which makes it necessary for the corresponding metal mask to use the slit-type or slot-type opening. However, the slit-type and slot-type openings are flawed, resulting that opening type of the blue metal mask in IGNIS pixel arrangement significantly affects further improvement of opening ratio of the sub-pixels and PPI.

In addition, in the organic light emitting display device, generally the opening ratio of the sub-pixel will be decreased with the enhancement of the resolution, finally leading to enhancement of work brightness of monochrome device and shortening the life of the display.

SUMMARY

Based on the above, there is a need to provide a pixel structure which may effectively improve OLED display resolution, reduce production cost and increase production yield, and an organic light emitting display using the pixel structure.

A pixel structure includes a plurality of pixels with each pixel includes a plurality of sub-pixels, at least one pixel forms a pixel unit, and longitudinally adjacent and/or laterally adjacent pixel units are arranged in a mirror image.

In one embodiment, the longitudinally adjacent and/or laterally adjacent pixel units are of the same arrangement structure.

In one embodiment, the arrangement structure of any one of the pixel units remains unchanged after the pixel unit is rotated around a center of the pixel unit by 180 degrees. Or the arrangement structure of any one of the pixel units is the same with that of the longitudinally adjacent and/or laterally adjacent pixel unit after the pixel unit is rotated around a center of the pixel unit by 180 degrees.

In one embodiment, any one of the pixel units is of the same arrangement structure or a mirror image with its adjacent pixel unit in the diagonal direction.

In one embodiment, an odd number of longitudinally adjacent pixels or laterally adjacent pixels form one pixel unit.

In one embodiment, an even number of longitudinally adjacent pixels or laterally adjacent pixels form one pixel unit.

In one embodiment, an even number of pixels simultaneously located in longitudinally adjacent row and laterally adjacent column form one pixel unit.

In one embodiment, the sub-pixels constituting the pixel are a triangle.

In one embodiment, the pixel includes an R sub-pixel, a G sub-pixel and a B sub-pixel.

The present disclosure also provides an organic light emitting display including the pixel structure.

The present disclosure may increase the area of mask opening during evaporation, reduce the difficulty of mask production process, and reduce the evaporation process difficulty by a reasonable pixel arrangement structure and allow sub-pixels of adjacent pixels to share one mask opening to evaporate. It does not need to preset a gap during evaporating the sub-pixels of adjacent pixels of the mask, thereby a real high PPI is achieved while keeping the opening ratio. In addition, the present disclosure can further increase the strength of the mask, which makes the mask not easy to deform during use, improving production yield, increasing life of the mask and reducing the cost.

DETAILED DESCRIPTION OF THE PREFERRED EMBODIMENTS

In the following, the specific embodiments of the present disclosure will be described in detail with reference to the drawings, in order to make the above mentioned objects, features and advantages of the present disclosure more fully understood. In the following description, numerous specific details are set forth in order to fully understand the present disclosure. However, the present disclosure can be implemented in many other ways different from those described herein. It is understand that a person skilled in the art can make similar improvements without departing from the connotation of the present disclosure, therefore the present disclosure is not limited to the embodiments disclosed herein.

By a reasonable pixel arrangement structure, the present disclosure achieves sub-pixels of a plurality of pixels may share the same one mask opening, which may increase area of the mask opening during evaporation, reduce difficulty of the mask production process, and reduce evaporation process difficulty. The resolution of a display may be improved by changing a pixel arrangement, when the mask opening is preset.

Embodiment 1

Figure 3:
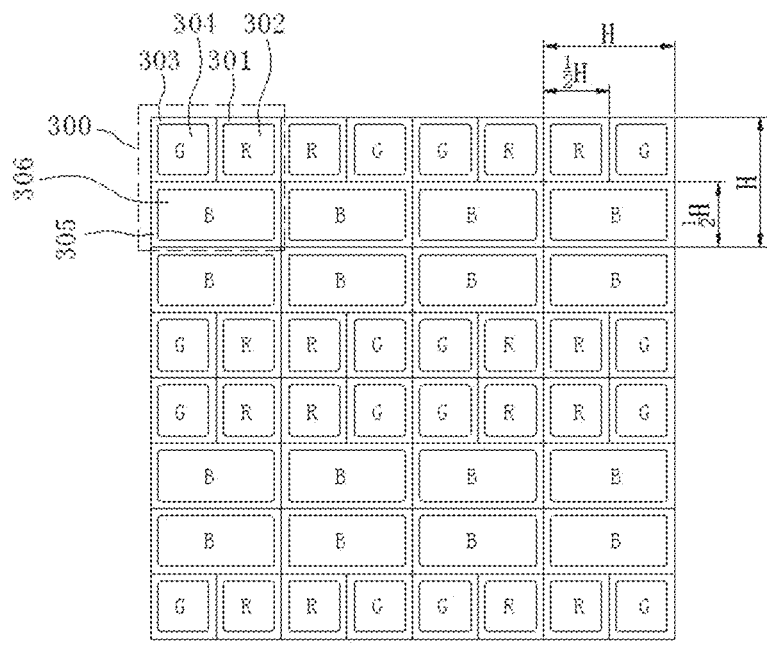
FIG. 3 shows a schematic diagram of the pixel structure of an organic light emitting display according to a first embodiment of the present disclosure.

FIG. 3 shows a schematic diagram of a pixel structure of an organic light emitting display according to a first embodiment of the present disclosure. As shown in FIG. 3, a display includes a plurality of pixels 300, each of which is composed of a plurality of sub-pixels. Each of the pixels 300 includes an R sub-pixel region 301, a R light emitting region 302, a G sub-pixel region 303, a G light emitting region 304, a B sub-pixel region 305 and a B light emitting region 306. A size of each of the pixels is H×H.

In the embodiment, a R sub-pixel, a G sub-pixel and a B sub-pixel of each of the pixels are all quadrilateral. Wherein, the length and width of the R sub-pixel and the G sub-pixel are both 1/2H, while the width of the B sub-pixel is H, and high of the B sub-pixel is 1/2H, that is, area of B sub-pixel is twice as much as that of the G sub-pixel or the R sub-pixel.

Wherein, each of the pixel units of the embodiment may be composed of longitudinally adjacent odd-numbered (e.g. one) pixels or laterally adjacent odd-numbered (e.g. one) pixels. In this case the pixel unit has following features: (a1) laterally adjacent pixel units are arranged in a horizontal mirror image; (a2) longitudinally adjacent pixel units are arranged in a vertical mirror image. When the one pixel unit is composed of longitudinally adjacent three or five etc. odd-numbered pixels or laterally adjacent three or five etc. odd-numbered pixels, it also has the above features (a1) and (a2).

Each of the pixel units may also be composed of laterally adjacent even-numbered (e.g. two) pixels. In this case the pixel unit has following features: (a1) laterally adjacent pixel units are arranged in a horizontal mirror image; (a2) longitudinally adjacent pixel units are arranged in a vertical mirror image; (a3) the laterally adjacent pixel units are of the same arrangement structure. When the one pixel unit is composed of laterally adjacent four or six etc. even-numbered pixels, it also has the above features (a1), (a2) and (a3).

Each of the pixel units may also be composed of longitudinally adjacent even-numbered (e.g. two) pixels. In this case the pixel unit has following features: (a1) laterally adjacent pixel units are arranged in a horizontal mirror image; (a2) longitudinally adjacent pixel units are arranged in a vertical mirror image; (a4) the longitudinally adjacent pixel units are of the same arrangement structure. When the one pixel unit is composed of longitudinally adjacent four or six etc. even-numbered pixels, it also has the above features (a1), (a2) and (a4).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (a1) laterally adjacent pixel units are arranged in a horizontal mirror image; (a2) longitudinally adjacent pixel units are arranged in a vertical mirror image; (a3) the laterally adjacent pixel units are of the same arrangement structure; (a4) the longitudinally adjacent pixel units are of the same arrangement structure; (a5) the pixel in the pixel unit show a central symmetry arrangement about a center of the pixel unit, i.e. the structure of the pixel unit is not changed after rotated around its center by 180 degrees. When the one pixel unit is composed of the even-numbered pixels simultaneously located longitudinally adjacent four and six etc. rows, laterally adjacent four and six etc. columns, it also has the above features (a1), (a2), (a3), (a4), and (a5).

Specifically, as shown in FIG. 3, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 3, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

As can be seen from FIG. 3, the B sub-pixel of the pixel (1, 1) is located in the lower portion of the pixel, while the G sub-pixel and the R sub-pixel are located in the upper portion of the pixel side by side, and the G sub-pixel is on the left, the R sub-pixel is on the right. The B sub-pixel of the pixel (1, 2) laterally adjacent to the pixel (1, 1) is located in the lower portion of the pixel, while the G sub-pixel and the R sub-pixel thereof are located in the upper portion of the pixel, and the R sub-pixel is on the left, and the G sub-pixel is on the right. It can be seen that, the pixel structure of the pixel (1, 2) is a horizontal mirror image with respect to that of the pixel (1, 1). The B sub-pixel of the pixel (2, 1) longitudinally adjacent to the pixel (1, 1) is located in the upper portion of the pixel, while the G sub-pixel and the R sub-pixel thereof are located in the lower portion of the pixel, and the G sub-pixel is on the left, and the R sub-pixel is on the right. It can be seen that, the pixel structure of the pixel (2, 1) is a vertical mirror image with respect to that of the pixel (1, 1). The B sub-pixel of the pixel (2, 2) as shown in FIG. 3 is located in the upper portion of the pixel, while the G sub-pixel and the R sub-pixel thereof are located in the lower portion of the pixel, and the R sub-pixel is on the left, and the G sub-pixel is on the right. It also can be seen from FIG. 3, the pixel structure of each odd-numbered column and the pixel structure of each even-numbered column belonging to the same row are respectively the same, and the pixel structure of each odd-numbered row and the pixel structure of each even-numbered row belonging to the same column are respectively the same. At the same time, it can be obtained that the pixel (1, 1) and the pixel (2, 2) are symmetrical about the center, and the pixel (1, 2) and the pixel (2, 1) are symmetrical about the center. Thus, the sub-pixels with the same color in adjacent rows and/or adjacent columns are arranged together, thereby the sub-pixels may share one mask opening during evaporation, that is, a plurality of the sub-pixels may be evaporated through the one mask opening. Therefore, more sub-pixels may be evaporated when the size of the mask opening is set, improving pixel density, i.e. improving the resolution of the organic light emitting display. Further, in the embodiment, color arrangement of the sub-pixel of each of the pixels is not limited to the arrangement as shown in FIG. 3, wherein the R, G, and B three colors may be changed with one another, as long as the arrangement thereof is consistent with the features disclosed in the figure.

Figure 3A:
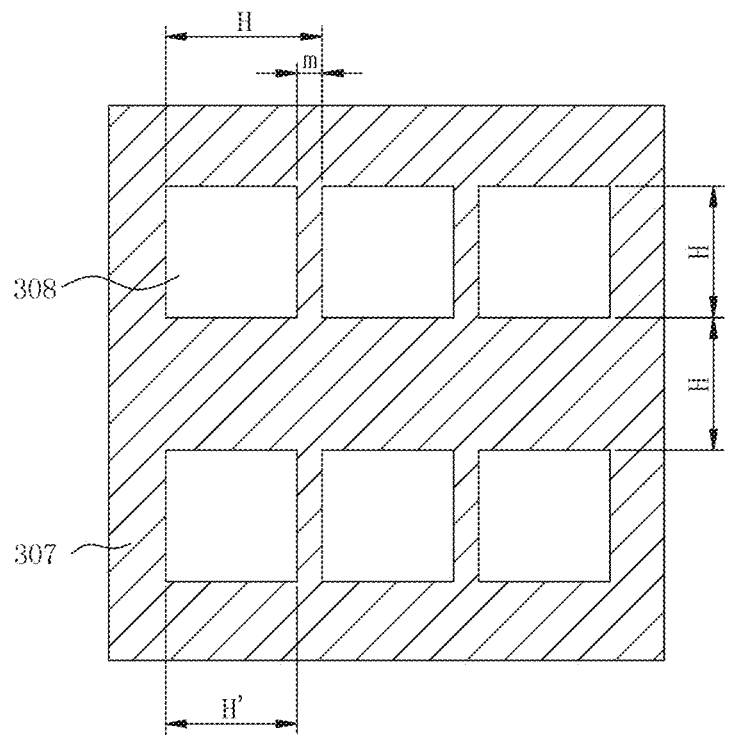
FIG. 3A shows a schematic diagram of one mask opening of the B sub-pixel according to the embodiment as illustrated in FIG. 3.
Figure 3B:
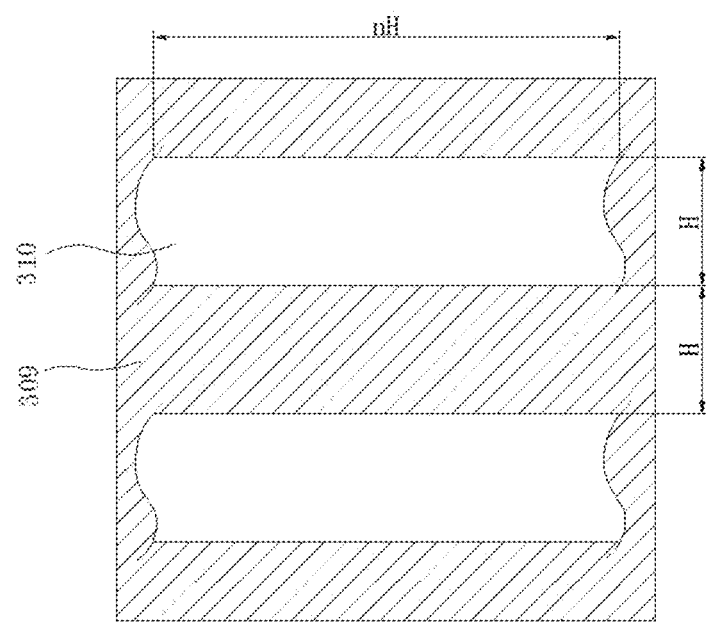
FIG. 3B shows a schematic diagram of another mask opening of the B sub-pixel according to the embodiment as illustrated in FIG. 3.
Figure 3C:
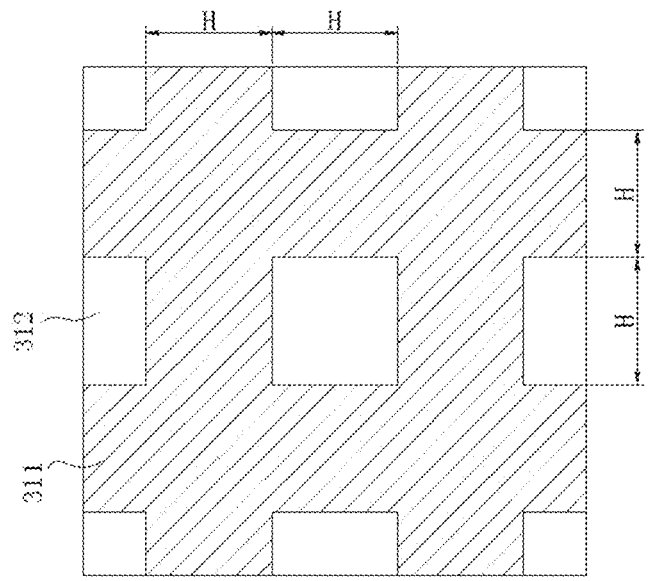
FIG. 3C shows a schematic diagram of the mask opening of the R or G sub-pixel according to the embodiment as illustrated in FIG. 3.

FIG. 3A, FIG. 3B, and FIG. 3C respectively show a schematic diagram of an embodiment of evaporation mask of the pixel structure as illustrated in FIG. 3. Wherein, FIG. 3A and FIG. 3B are embodiments of two evaporation masks for evaporating the B sub-pixel. The embodiment as illustrated in FIG. 3A, in the embodiment, the evaporation mask includes an evaporated occlusion region 307 and an evaporated region opening 308, wherein the opening 308 is a slot-type, whose length is H, width H' is H subtracting a gap width m. During evaporating, the B sub-pixels of the pixels in longitudinally adjacent two rows belonging to the same column as shown in FIG. 3 may be evaporated at the same time through the opening 308. While in the embodiment as illustrated in FIG. 3B, the evaporation mask includes an evaporated occlusion region 309 and an evaporated region opening 310, wherein the opening 310 is a slit-type, whose length is H, and a distance between the adjacent openings 310 is also H. During evaporating, the B sub-pixels of longitudinally adjacent two rows in the all columns as shown in FIG. 3 may be evaporated at the same time through the opening 309.

Figure 1:
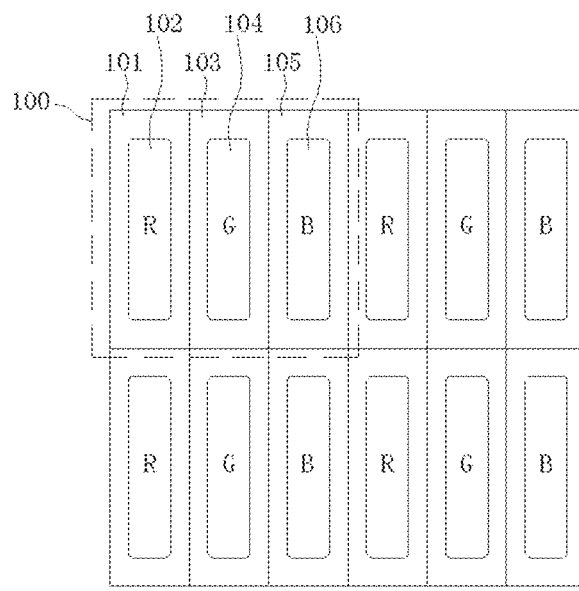
FIG. 1 shows a schematic diagram of a pixel arrangement of a traditional organic light emitting display.
Figure 1A:
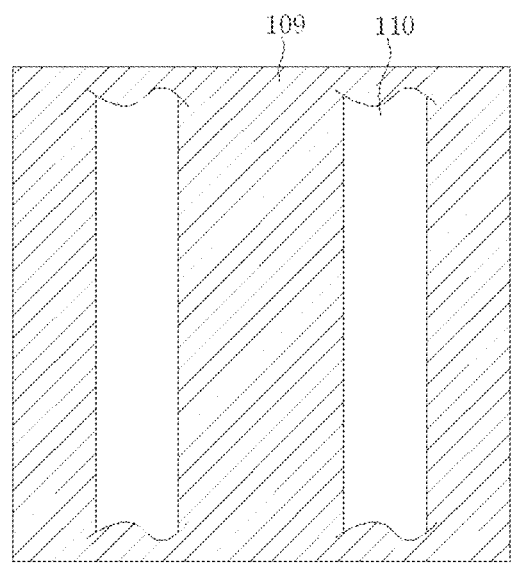
FIG. 1A shows a schematic diagram of one mask opening of FIG. 1.
Figure 1B:
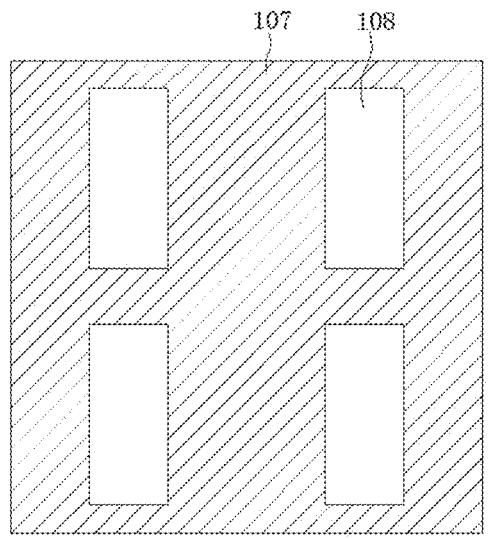
FIG. 1B shows a schematic diagram of another mask opening of FIG. 1.
Figure 2:
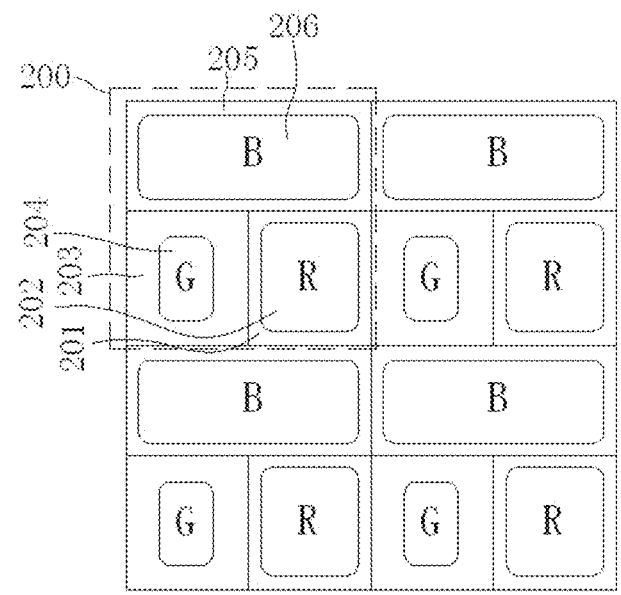
FIG. 2 shows a schematic diagram of the pixel arrangement structure of IGNIS.
Figure 2A:
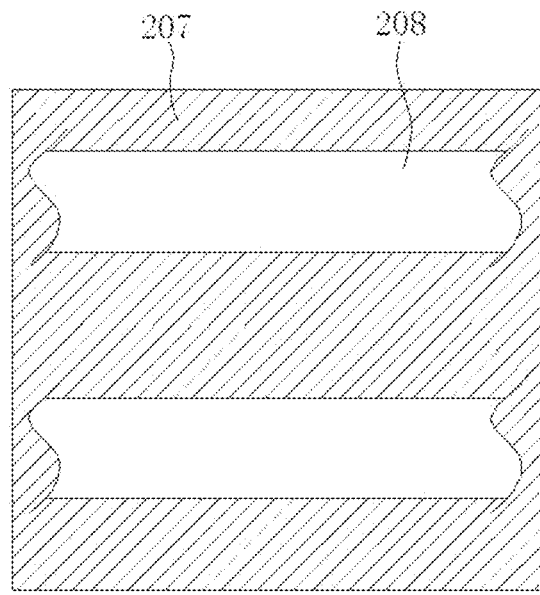
FIG. 2A shows a schematic diagram of one mask opening of a B sub-pixel of FIG. 2.
Figure 2B:
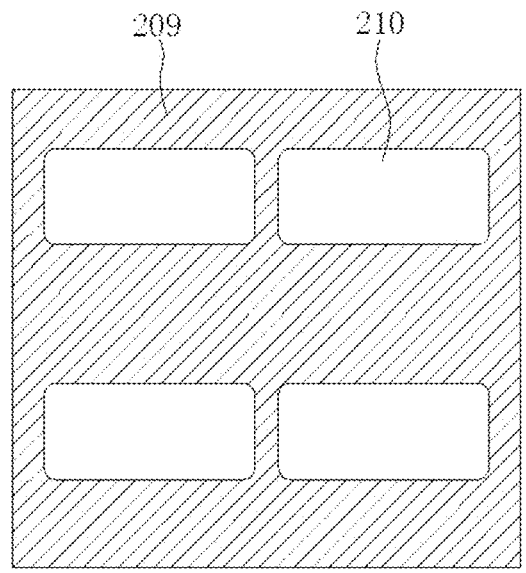
FIG. 2B shows a schematic diagram of another mask opening of the B sub-pixel of FIG. 2.
Figure 2C:
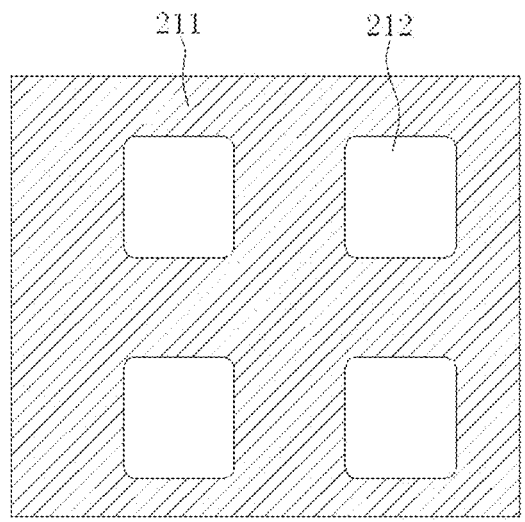
FIG. 2C shows a schematic diagram of a mask opening of a R or a G sub-pixel of FIG. 2.

FIG. 3C shows a schematic diagram of an embodiment of an evaporation mask for evaporating the R sub-pixel and the G sub-pixel. In this embodiment, the evaporation mask includes an evaporated occlusion region 311 and an evaporated region opening 312, wherein the opening 312 is a slot-type, whose length and width are both H, and a distance between adjacent openings 312 is also H. During evaporating, the R sub-pixels and the G sub-pixels of four adjacent pixels belonging to adjacent two rows and adjacent two columns of the embodiment as illustrated in FIG. 3 may be evaporated at the same time through the opening 312. It can be seen that, the four same sub-pixels may be evaporated at the same time through the same one opening, solving the problem of limitation to improving the resolution by the evaporation mask, significantly improving the resolution. This arrangement which may also be applied to production of mask with large size may increase the mask opening, and further reduce the difficulty of mask production process. Horizontal and vertical spacing of the mask opening of the R sub-pixel and the G sub-pixel are increased accordingly, and the vertical spacing of the B sub-pixel is increased, which may increase the strength of the mask during use. In particular, based on a minimum mask opening of 40 um obtained by modern techniques, using the pixel arrangement of the prior art as illustrated in FIG. 1, the size of each of the pixels is at least 3*40 um=120 um, and 1 inch (25400 um) is divided by the size of each of the pixels, i.e. 25400 um/120 um, obtaining a resolution of up to 212 PPI. Using IGNIS arrangement, the size of each of the pixels is at least 2*40 um=80 um, then the PPI is 25400 um/80 um=317 PPI. While using the pixel arrangement of the present disclosure as illustrated in FIG. 3, the size of each of the pixels is 40 um, so resolution is 25400 um/40 um=635 PPI.

Of course, the above embodiments are only preferred embodiments of the present disclosure. Other evaporation mask may be used as required in practical applications. For example, the B sub-pixels of all the pixels belonging to the same row may be evaporated at the same time through the same opening of slit-type evaporation mask, or the R sub-pixels (or G sub-pixels) of laterally adjacent even-numbered (such as two) pixels or R sub-pixels (or G sub-pixels) of longitudinally adjacent even-numbered (such as two) may be evaporated at the same time through the same opening of slot-type evaporation mask. In addition, in order to avoid color mixing, two masks may be used to evaporate the R sub-pixel and the G sub-pixel separately.

Figure 4:
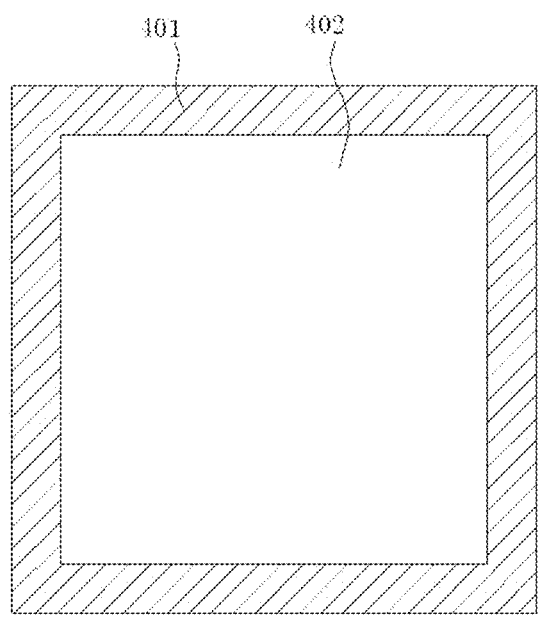
FIG. 4 shows a schematic diagram of a further mask opening of the B sub-pixel according to the embodiment as illustrated in FIG. 3.

Further, the evaporation mask for evaporating the B sub-pixel as illustrated in FIG. 4 may be used. The evaporation mask includes an evaporated occlusion region 401 and an evaporated region opening 402 of the B sub-pixel. Wherein, there is only one evaporated region opening 402 which may cover all display region of the display, that is, the B sub-pixel is evaporated in all the display region, then the R sub-pixel and the G sub-pixel are evaporated separately in the regions corresponding to the R sub-pixel and the G sub-pixel. Currently, brightness of the B sub-pixel in the OLED device is the lowest, accordingly the light emitting area required is larger, that is the opening ratio of the B sub-pixel will occupy the largest area in a single pixel. Therefore, common blue may be used, i.e. the B sub-pixel is evaporated in all the pixel, thus the B sub-pixel will not sacrifice the opening ratio due to alignment error and "shadow effect", at the same time reducing precision requirements of an alignment mechanism. The evaporation mask of the R sub-pixel and G sub-pixel are the same as that illustrated in FIG. 3C, which will not be described herein.

Embodiment 2

Figure 5:
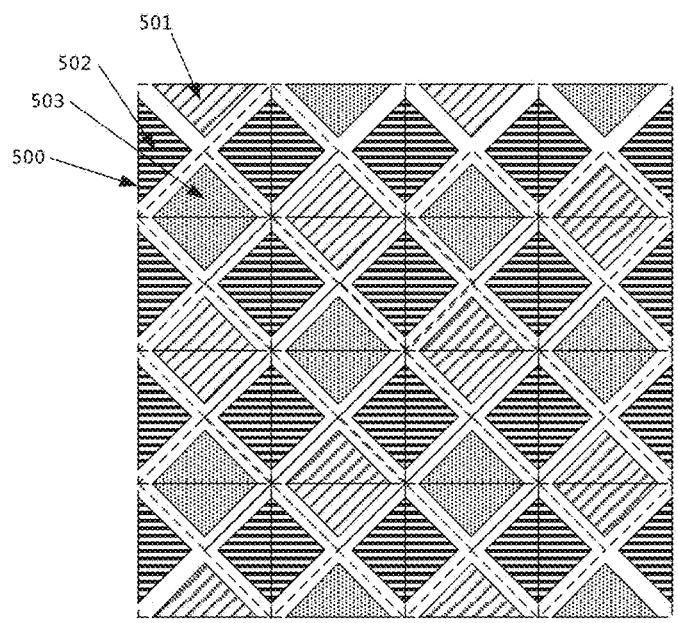
FIG. 5 shows a schematic diagram of the pixel structure of the organic light emitting display according to a second embodiment of the present disclosure.

FIG. 5 shows a second embodiment of the present disclosure. In the embodiment, the display includes a plurality of pixels 500, each of which is composed of a plurality of sub-pixels. Each of the sub-pixels is a triangle. Preferably, as shown in FIG. 5, each of the sub-pixels is a right angled isosceles triangle, and further one pixel is composed of right angles of every four sub-pixels arranged oppositely together. The four sub-pixels constituting the one pixel includes one R sub-pixel 501, one G sub-pixel 503, and two B sub-pixels 502, wherein the two B sub-pixels 502 are arranged oppositely to each other. In this way, the area of the B sub-pixel 502 is twice as much as that of the R sub-pixel 501 or the G sub-pixel 503, ensuring the display effect of the display.

As shown in FIG. 5, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 5, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In order to share the same opening, in the embodiment the sub-pixels with the same color of the adjacent pixels arranged together. As shown in FIG. 5, each of the pixels is divided into four regions by an inclined cross (i.e. diagonal of the pixel), and the four regions are respectively an upper region, a lower region, a left region, and a right region, each of which is one sub-pixel. In the embodiment, the R sub-pixel 501 of the pixel (1, 1) is located in the upper region of the pixel, G sub-pixel 503 is located in the lower region of the pixel, and the left region and right region of the pixel are both the B sub-pixel 502. While the R sub-pixel of the pixel (1, 2) is located in the lower region of the pixel, the G sub-pixel is located in the upper region of the pixel, and the left region and right region of the pixel are both the B sub-pixel. The R sub-pixel of the pixel (2, 1) is located in the lower region of the pixel, the G sub-pixel is located in the upper region of the pixel, and the left region and right region of the pixel are both the B sub-pixel. It can be seen that the B sub-pixel in the right region of the pixel (1, 1) and the B sub-pixel in the left region of the pixel (1, 2) are arranged together, while the G sub-pixel in the lower region of the pixel (1, 1) and the G sub-pixel in the pixel (2, 1) are arranged together, and the R sub-pixel in the lower region of the pixel (1, 2) and the R sub-pixel of the pixel (2, 2) are arranged together. Other pixels have similar arrangement regulation.

Wherein, each of pixel units of the embodiment may be composed of longitudinally adjacent odd-numbered (e.g. one) pixels or laterally adjacent odd-numbered (e.g. one) pixels. In this case the pixel unit has following features: (b1) longitudinally adjacent pixel units are arranged in a vertical mirror image; (b4) after any one of the pixel units is rotated around a center of the pixel unit by 180 degrees, the arrangement structure thereof is the same with that of the laterally adjacent pixel unit; (b5) after any one of the pixel units is rotated around a center of the pixel unit by 180 degrees, the arrangement structure thereof is the same with that of the longitudinally adjacent pixel unit; (b6) any one of the pixel units is of the same arrangement structure with its adjacent pixel unit in the diagonal direction. When the one pixel unit is composed of longitudinally adjacent three or five etc. odd-numbered pixels or laterally adjacent three or five etc. odd-numbered pixels, it also has the above features (b1), (b4), (b5) and (b6).

Each of the pixel units may also be composed of laterally adjacent even-numbered (e.g. two) pixels. In this case the pixel unit has following features: (b1) longitudinally adjacent pixel units are arranged in a vertical mirror image; (b2) laterally adjacent pixel units are of the same arrangement structure; (b4) after any one of the pixel units is rotated by 180 degrees, the arrangement structure thereof is the same with that of the laterally adjacent pixel unit. When the one pixel unit is composed of laterally adjacent four or six etc. even-numbered pixels, it also has the above features (b1), (b2) and (b4).

Each of the pixel units may also be composed of longitudinally adjacent even-numbered (e.g. two) pixels. In this case the pixel unit has following features: (b1) longitudinally adjacent pixel units are arranged in a vertical mirror image; (b3) longitudinally adjacent pixel units are of the same arrangement structure; (b5) after any one of the pixel units is rotated by 180 degrees, the arrangement structure thereof is the same with that of the longitudinally adjacent pixel unit. When the one pixel unit is composed of longitudinally adjacent four or six etc. even-numbered pixels, it also has the above features (b1), (b3) and (b5).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (b1) longitudinally adjacent pixel units are arranged in a vertical mirror image; (b2) laterally adjacent pixel units are of the same arrangement structure; (b3) longitudinally adjacent pixel units are of the same arrangement structure; (b6) any one of the pixel units is of the same arrangement structure with its adjacent pixel unit in the diagonal direction. When the one pixel is composed of the even-numbered pixels simultaneously located longitudinally adjacent four and six etc. rows, laterally adjacent four and six etc. columns, it also has the above features (b1), (b2), (b3), and (b6).

Further, in the embodiment, color arrangement of the sub-pixel of each of the pixels is not limited to the arrangement shown in FIG. 5, wherein the R, G, and B three colors may be changed with one another, as long as the arrangement thereof is consistent with the features disclosed in the figure.

Figure 5A:
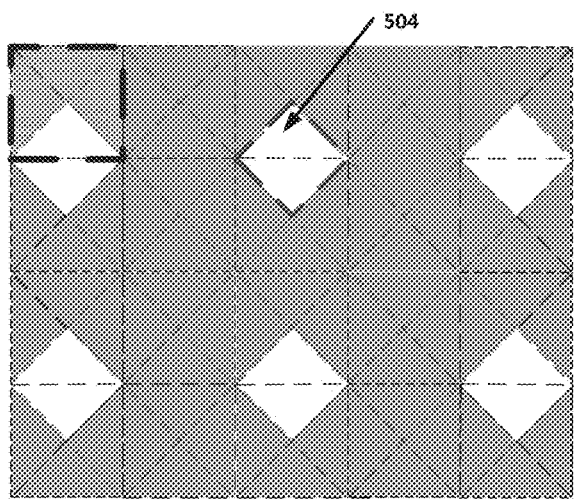
FIG. 5A shows a schematic diagram of one mask opening of the B sub-pixel according to the embodiment as illustrated in FIG. 5.
Figure 5B:
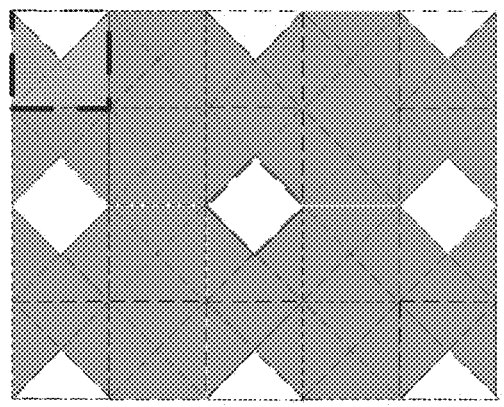
FIG. 5B shows a schematic diagram of another mask opening of the B sub-pixel according to the embodiment as illustrated in FIG. 5.
Figure 5C:
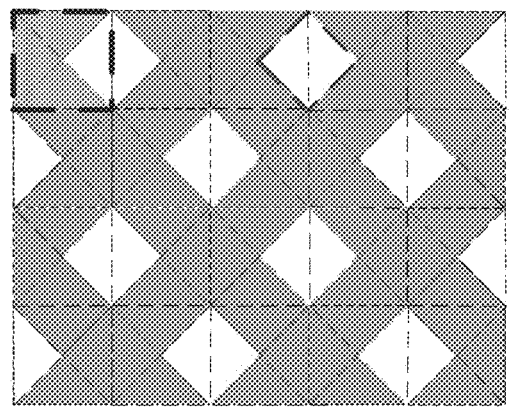
FIG. 5C shows a schematic diagram of one mask opening of the R sub-pixel according to the embodiment as illustrated in FIG. 5.
Figure 5D:
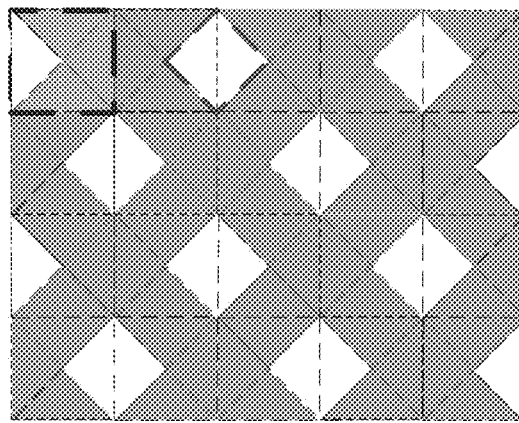
FIG. 5D shows a schematic diagram of one mask opening of the G sub-pixel according to the embodiment as illustrated in FIG. 5.

FIG. 5A shows a schematic diagram of one mask opening of the B sub-pixel according to the present disclosure as illustrated in FIG. 5. In the embodiment, a mask opening 504 is an inclined square, and the diagonal length of the square opening is equal to the width of one pixel. As can be seen from FIG. 5, corners of each of the B sub-pixel regions (region composed of the B sub-pixels of two adjacent pixels, corresponding to one mask opening) are opposite. Therefore, if using one mask to complete the evaporation of the B sub-pixel in the entire surface of the display, the mask opening will connect together, and it can not be implemented. Even if a bridge which must be kept very small to ensure pixel area is set between the mask openings, the strength of the mask can not be guarantee. Therefore, two masks are needed to complete the evaporation of the B sub-pixel. The openings on the two mask are arranged alternately with each other, as shown in FIG. 5A and FIG. 5B. Thus, one part of the B sub-pixels is evaporated using the mask as shown in FIG. 5A firstly, then the remaining B sub-pixels among the evaporated B sub-pixels is evaporated using the mask as shown in FIG. 5B. Of course, in other embodiments, only one mask may also be used, and a structure of the mask is consistence with that of the mask shown in FIG. 5A and FIG. 5B, but its size is larger than the display region, so one part of the B sub-pixels may be evaporated using the mask firstly, then translating laterally or longitudinal the mask by one pixel distance, to evaporate the remaining B sub-pixels. Thus one mask may be saved while achieving the same effect. The structure of the mask for the R sub-pixel and the G sub-pixel as shown in FIG. 5C and FIG. 5D is respectively similar to that of the mask as shown in FIG. 5A and FIG. 5B, except position of the opening, which is not described herein. Of course, in other embodiments, only one mask may be used to evaporate the sub-pixels with all colors, In particular by moving the position of the mask to correspond to the positions of the sub-pixels with different colors.

Similarly, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. In the embodiment, the width of each of the pixels is equal to the length of diagonal of the mask opening. Based on a minimum mask opening of 40 um obtained by modern techniques, the size of each of the pixels is about 56.6 um, then resolution of the organic light emitting display using the pixel structure according to the embodiment may reach to 450 PPI. In addition, it can be seen from FIG. 5A to FIG. 5D, the spacing between the mask openings is equal to the width of the mask opening, significantly improved the strength of the mask.

In the embodiment as shown in FIG. 5, the position of the sub-pixels with different colors may be change with one another, as long as the arrangement thereof after changed is consistent with the features disclosed above.

Embodiment 3

Figure 6:
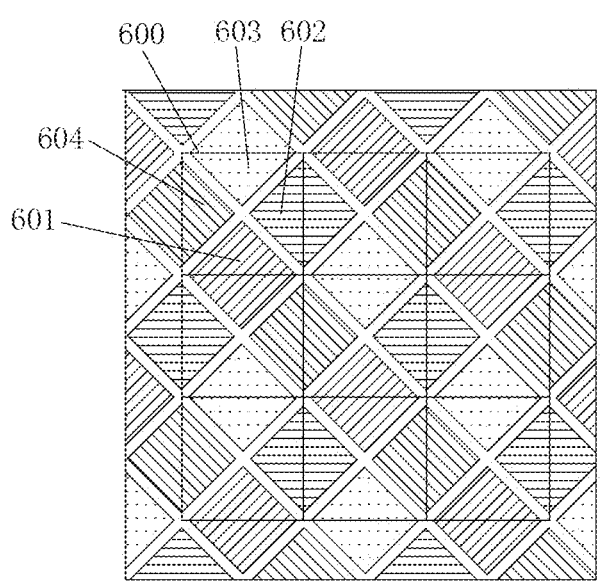
FIG. 6 shows a schematic diagram of the pixel structure of the organic light emitting display according to a third embodiment of the present disclosure.

For embodiment 2, part colors of the sub-pixels may be changed with other colors, as illustrated in the third embodiment of the present disclosure shown in FIG. 6. In the embodiment, each of the pixels 600 is separately composed of a R sub-pixel 601, a G sub-pixel 603, a B sub-pixel 602, and a W sub-pixel 604 (white). Compared with the embodiment as shown in FIG. 5, the one B sub-pixel is changed with the W sub-pixel 604, and the position of the R sub-pixel and the position of the G sub-pixel are changed with each other. An advantage of the embodiment is that each of the pixels includes the one W sub-pixel, which may be more pure when displaying white, to achieve higher brightness.

In particular, as shown in FIG. 6, the display includes a plurality of pixels 600, each of which is composed of a plurality of sub-pixels. Each of the sub-pixels is a triangle. Preferably, as shown in FIG. 6, each of the sub-pixels is a right angled isosceles triangle, and further right angles of every four sub-pixels are arranged oppositely together to constitute one pixel. The four sub-pixels constituting the one pixel include the one R sub-pixel 501, the one G sub-pixel 503, and the one B sub-pixels 502, and the one W sub-pixel 604.

As shown in FIG. 6, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 6, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In order to share the same opening, in the embodiment the sub-pixels with the same color of the adjacent pixels arranged together. As shown in FIG. 6, each of the pixels is divided into four regions by an inclined cross, and the four regions are respectively an upper region, a lower region, a left region, and a right region, each of which is one sub-pixel. In the embodiment, the R sub-pixel 601 of the pixel (1, 1) 600 is located in the lower region of the pixel, the G sub-pixel 603 is located in the upper region of the pixel, and the left region of the pixel is the W sub-pixel 604, and the right region is the B sub-pixel 602. While the R sub-pixel of the pixel (1, 2) is located in the upper region of the pixel, the G sub-pixel is located in the lower region of the pixel, and the left region and right region of the pixel are the B sub-pixel and the W sub-pixel respectively. The R sub-pixel of the pixel (2, 1) is located in the upper region of the pixel, the G sub-pixel is located in the lower region of the pixel, and the left region and right region of the pixel are the B sub-pixel and the W sub-pixel respectively. It can be seen that the B sub-pixel of the right region of the pixel (1, 1) and the B sub-pixel of the left region of the pixel (1, 2) are arranged together, while the R sub-pixel of the lower region of the pixel (1, 1) and the R sub-pixel of the pixel (2, 1) are arranged together. Other pixels have similar arrangement regulation.

Further, in the embodiment, color arrangement of the sub-pixel of each of the pixels is not limited to the arrangement shown in FIG. 6, wherein the R, G, B, and W four colors may be changed with one another, as long as the arrangement thereof is consistent with the features disclosed in the figure.

The structure features as shown in FIG. 6 is the same with that of the embodiment 2 as shown in FIG. 5, and the same mask as used in the embodiment 2 as shown in FIG. 5 may also be used, which is not described herein.

Embodiment 4

Figure 7:
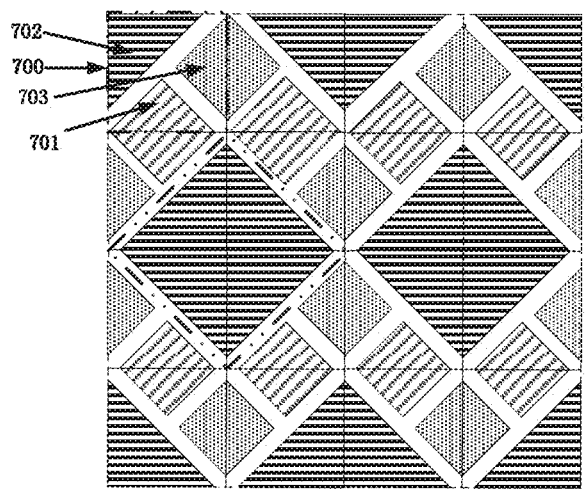
FIG. 7 shows a schematic diagram of the pixel structure of the organic light emitting display according to a forth embodiment of the present disclosure.

FIG. 7 shows a forth embodiment of the present disclosure. In the embodiment, the display includes a plurality of pixels 700, each of which is composed of a plurality of sub-pixels. Each of the sub-pixels is a triangle. Preferably, as shown in FIG. 7, each of the sub-pixels is a right angled isosceles triangle. Compared with the embodiment as shown in FIG. 5 (embodiment 2), the difference is that a R sub-pixel 701 and a G sub-pixel 703 belonging to the same pixel are arranged adjacently, and a B sub-pixels 702 are arranged adjacently and combined to one sub-pixel. Similarly, in order to share the same opening, in the embodiment the sub-pixels with the same color of the adjacent pixels are arranged together.

As shown in FIG. 7, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 7, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In particular, as shown in FIG. 7, the right region and the lower region of the pixel (1, 1) 700 are respectively the G sub-pixel 703 and the R sub-pixel 701, while the B sub-pixels 702 are located in the upper region and the left region of the pixel; the left region and the lower region of the pixel (1, 2) are respectively the G sub-pixel and the R sub-pixel, while the B sub-pixels are located in the upper region and the right region of the pixel; the upper region and the left region of the pixel (2, 1) are respectively the R sub-pixel and the G sub-pixel, while the B sub-pixels are located in the right region and the lower region of the pixel. In the embodiment, positions of the R sub-pixel 701 and G sub-pixel 703 of every pixel may be changed with each other simultaneously.

Wherein, each of pixel units of the embodiment may be composed of longitudinally adjacent odd-numbered (e.g. one) pixels or laterally adjacent odd-numbered (e.g. one) pixels. In this case the pixel unit has following features: (c1) laterally adjacent pixel units are arranged in a horizontal mirror image; (c4) after any one of the pixel units is rotated around a center of the pixel unit by 180 degrees, the arrangement structure thereof is the same with that of the longitudinally adjacent pixel unit; (c5) any one of the pixel units and its adjacent pixel unit in the diagonal direction are arranged in a vertical mirror image. When the one pixel unit is composed of longitudinally adjacent three or five etc. odd-numbered pixels or laterally adjacent three or five etc. odd-numbered pixels, it also has the above features (c1), (c4) and (c5).

Each of the pixel units may also be composed of laterally adjacent even-numbered (e.g. two) pixels. In this case the pixel unit has following features: (c1) laterally adjacent pixel units are arranged in a horizontal mirror image; (c3) laterally adjacent pixel units are of the same arrangement structure; (c4) after any one of the pixel units is rotated around a center of the pixel unit by 180 degrees, the arrangement structure thereof is the same with that of the longitudinally adjacent pixel unit; (c5) any one of the pixel units and its adjacent pixel unit in the diagonal direction are arranged in a vertical mirror image. When the one pixel unit is composed of laterally adjacent four or six etc. even-numbered pixels, it also has the above features (c1), (c3), (c4) and (c5).

Each of the pixel units may also be composed of longitudinally adjacent even-numbered (e.g. two) pixels. In this case the pixel unit has following features: (c1) laterally adjacent pixel units are arranged in a horizontal mirror image; (c2) longitudinally adjacent pixel units are arranged in a vertical mirror image; (c4) after any one of the pixel units is rotated around a center of the pixel unit by 180 degrees, the arrangement structure thereof is the same with that of the longitudinally adjacent pixel unit. When the one pixel unit is composed of longitudinally adjacent four or six etc. even-numbered pixels, it also has the above features (c1), (c2) and (c4).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (c1) laterally adjacent pixel units are arranged in a horizontal mirror image; (c2) longitudinally adjacent pixel units are arranged in a vertical mirror image; (c3) laterally adjacent pixel units are of the same arrangement structure; (c5) any one of the pixel units and its adjacent pixel unit in the diagonal direction are arranged in a vertical mirror image. When the one pixel is composed of the even-numbered pixels simultaneously located longitudinally adjacent four and six etc. rows, laterally adjacent four and six etc. columns, it also has the above features (c1), (c2), (c3), and (c5).

Further, in the embodiment, color arrangement of the sub-pixel of each of the pixels is not limited to the arrangement shown in FIG. 7, wherein the R, G, and B three colors may be changed with one another, as long as the arrangement thereof is consistent with the features disclosed in the figure.

Figure 7A:
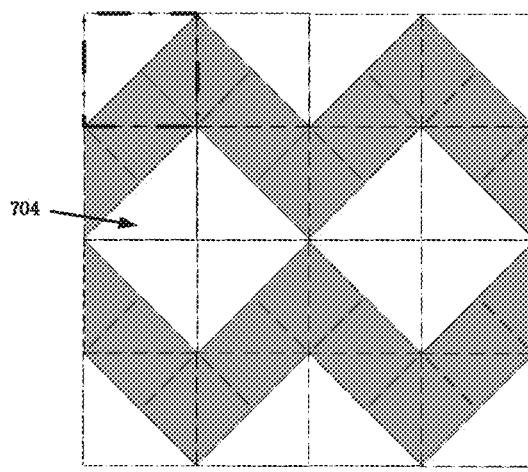
FIG. 7A shows a schematic diagram of one mask opening of the B sub-pixel according to the embodiment as illustrated in FIG. 7.
Figure 7B:
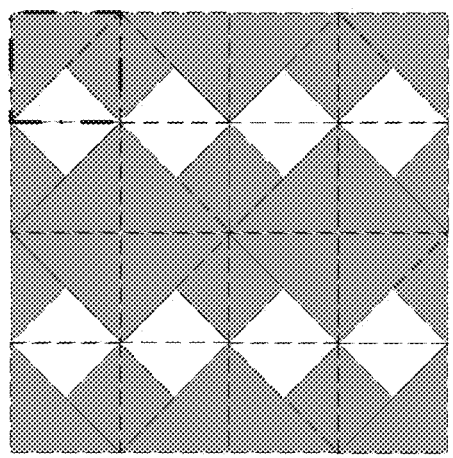
FIG. 7B shows a schematic diagram of one mask opening of the R sub-pixel according to the embodiment as illustrated in FIG. 7.
Figure 7C:
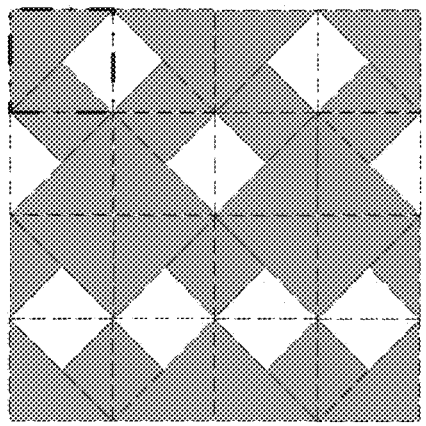
FIG. 7C shows a schematic diagram of one mask opening of the G sub-pixel according to the embodiment as illustrated in FIG. 7.

FIG. 7A shows a schematic diagram of one mask opening of the B sub-pixel according to the embodiment illustrated in FIG. 7. In the embodiment, a mask opening 704 for evaporating the B sub-pixel is a square, and the diagonal length of the square is twice as much as the width of one pixel, and the B sub-pixels of four adjacent pixels may be evaporated through one opening at the same time; FIG. 7B shows a schematic diagram of one mask opening of R sub-pixel according to the embodiment illustrated in FIG. 7. In the embodiment, the mask opening for evaporating the R sub-pixel is a square, and the diagonal length of the square is equal to the width of one pixel, and the R sub-pixels of two adjacent pixels may be evaporated through one opening at the same time; FIG. 7C shows a schematic diagram of one mask opening of G sub-pixel according to the embodiment illustrated in FIG. 7. In the embodiment, the mask opening for evaporating the G sub-pixel is a square, and the diagonal length of the square is equal to the width of one pixel, and the G sub-pixels of two adjacent pixels may be evaporated through one opening at the same time. As described above, the position of the R sub-pixel and the position of the G sub-pixel may be changed with each other, and when the positions are changed, the R sub-pixel is evaporated using the mask as shown in FIG. 7C, and G sub-pixel is evaporated using the mask as shown in FIG. 7B.

Figure 7D:
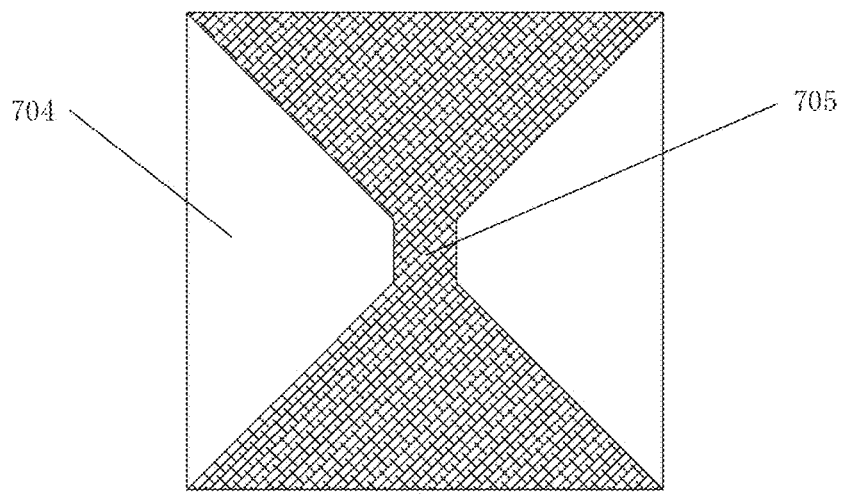
FIG. 7D shows a partially enlarged view of a connection between adjacent mask openings as illustrated in FIG. 7A to 7C.

It should be noted that in the mask as shown in FIG. 7A, FIG. 7B, and FIG. 7C, it is needed to form a bridge 705 (as shown in FIG. 7D) between laterally adjacent opening 704, to prevent the laterally adjacent opening 704 from connecting integrally, leading to the mask can not be molded. The bridge 705 makes a slight gap formed between the evaporated adjacent sub-pixels, but the slight gap will not affect the display effect of the sub-pixel and the overall resolution.

Similarly, the sub-pixels with the same color in adjacent rows and/or adjacent columns are arranged together, thereby the sub-pixels may share one mask opening during evaporation, that is, a plurality of the sub-pixels may be evaporated through one mask opening. Therefore, more sub-pixels may be evaporated when the size of the mask opening is set, improving pixel density, i.e. improving the resolution of the organic light emitting display. In the embodiment, the width of each of the pixels is equal to the length of diagonal of the mask opening which is used for evaporating the R sub-pixel and G sub-pixel. Based on a minimum mask opening of 40 um obtained by modern techniques, the size of each of the pixels is about 56.6 um, then resolution of the organic light emitting display using the pixel structure according to the embodiment may reach to 450 PPI.

Embodiment 5

Figure 8:
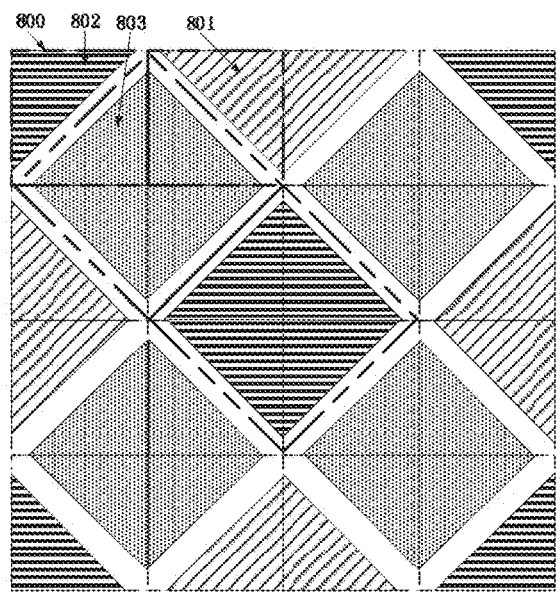
FIG. 8 shows a schematic diagram of the pixel structure of the organic light emitting display according to a fifth embodiment of the present disclosure.

FIG. 8 shows a fifth embodiment of the present disclosure. In the embodiment, the display includes a plurality of pixels 800, each of which is composed of a plurality of sub-pixels. Each of the sub-pixels is a triangle. Preferably, each of the sub-pixels is a right angled isosceles triangle. Wherein, in the embodiment, each of the pixels is composed of two color sub-pixels, the hypotenuses of the two color sub-pixels are arranged adjacently. Similarly, in order to share the same opening, in the embodiment the sub-pixels with the same color of the adjacent pixels are arranged together.

As shown in FIG. 8, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 8, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In particular, as shown in FIG. 8, each of the pixels is divided into a left upper region and a right lower region, or a left lower region and a right upper region by one oblique line. The left upper region of the pixel (1, 1) 800 is a B sub-pixel 802, the right lower region is a G sub-pixel 803; the left lower region of the pixel (1, 2) is the G sub-pixel 803, the right upper region is a R sub-pixel 801; the left lower region of the pixel (2, 1) is the R sub-pixel 801, the right upper region is the G sub-pixel 803; the left upper region of the pixel (2, 2) is the G sub-pixel 803, the right lower region is the B sub-pixel 802.

Wherein, each of the pixel units of the embodiment may be composed of longitudinally adjacent odd-numbered (e.g. one) pixels or laterally adjacent odd-numbered (e.g. one) pixels. In this case the pixel unit has following features: (d1) after the pixel unit is rotated around a center of the pixel unit by 180 degrees, the arrangement structure thereof is the same with that of the pixel unit in one diagonal thereof. When the one pixel unit is composed of longitudinally adjacent three or five etc. odd-numbered pixels or laterally adjacent three or five etc. odd-numbered pixels, it also has the above features (d1).

Each of the pixel units may also be composed of laterally adjacent even-numbered (e.g. two) pixels. In this case the pixel unit has following features: (d2) laterally adjacent pixel units are arranged in a horizontal mirror image; (d3) after the pixel unit is rotated around a center of the pixel unit by 180 degrees, the arrangement structure thereof is the same with that of the longitudinally adjacent pixel unit. When the one pixel unit is composed of laterally adjacent four or six etc. even-numbered pixels, it also has the above features (d2) and (d3).

Each of the pixel units may also be composed of longitudinally adjacent even-numbered (e.g. two) pixels. In this case the pixel unit has following features: (d4) longitudinally adjacent pixel units are arranged in a vertical mirror image; (d5) after the pixel unit is rotated around a center of the pixel unit by 180 degrees, the arrangement structure thereof is the same with that of the laterally adjacent pixel unit. When the one pixel unit is composed of longitudinally adjacent four or six etc. even-numbered pixels, it also has the above features (d4) and (d5).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (d1) after the pixel unit is rotated around a center of the pixel unit by 180 degrees, the arrangement structure thereof is the same with that of the pixel unit in one diagonal thereof; (d2) laterally adjacent pixel units are arranged in a horizontal mirror image; (d4) longitudinally adjacent pixel units are arranged in a vertical mirror image; (d6) the pixel in the pixel unit show a central symmetry arrangement about a center of the pixel unit, i.e. the structure of the pixel unit is not changed after rotated around its center by 180 degrees. When the one pixel is composed of the even-numbered pixels simultaneously located longitudinally adjacent four and six etc. rows, laterally adjacent four and six etc. columns, it also has the above features (d1), (d2), (d4), and (d6).

Figure 8A:
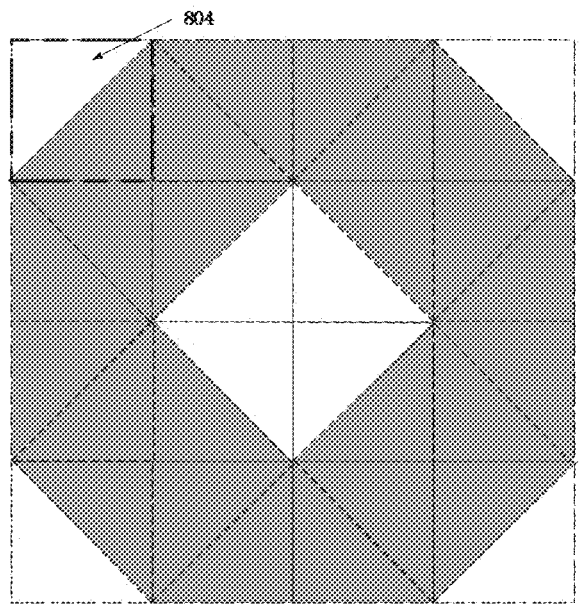
FIG. 8A shows a schematic diagram of one mask opening of the B sub-pixel according to the embodiment as illustrated in FIG. 8.
Figure 8B:
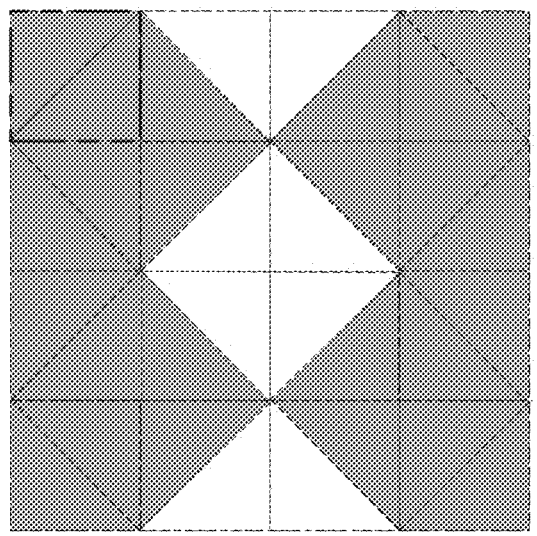
FIG. 8B shows a schematic diagram of one mask opening of the R sub-pixel according to the embodiment as illustrated in FIG. 8.
Figure 8C:
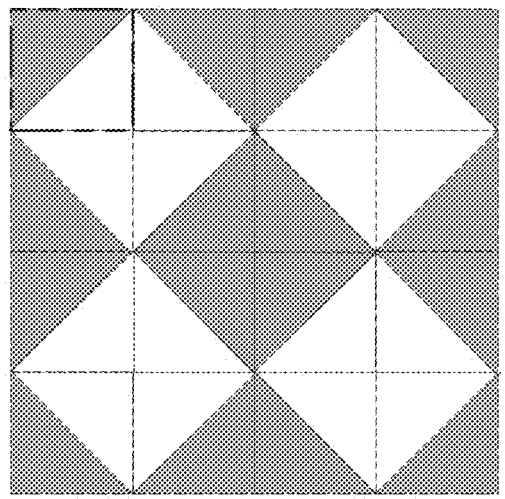
FIG. 8C shows a schematic diagram of one mask opening of the G sub-pixel according to the embodiment as illustrated in FIG. 8.

FIG. 8A shows a schematic diagram of one mask opening of the B sub-pixel according to the embodiment as illustrated in FIG. 8. In the embodiment, a mask opening 804 for evaporating the B sub-pixel is a square, and the diagonal length of the square is twice as much as the width of one pixel, and the B sub-pixels of four adjacent pixels may be evaporated through one opening at the same time; FIG. 8B shows a schematic diagram of one mask opening of the R sub-pixel according to the embodiment as illustrated in FIG. 8. In the embodiment, a mask opening for evaporating the R sub-pixel is a square, and the diagonal length of the square is twice as much as the width of one pixel, and R sub-pixels of four adjacent pixels may be evaporated through one opening at the same time; FIG. 8C shows a schematic diagram of one mask opening of the G sub-pixel according to the embodiment illustrated in FIG. 8. In the embodiment, a mask opening for evaporating the G sub-pixel is a square, and the diagonal length of the square is twice as much as the width of one pixel, and G sub-pixels of four adjacent pixels may be evaporated through one opening at the same time.

In the mask as shown in FIG. 8B, it is needed to form a bridge between longitudinally adjacent openings, to prevent the longitudinally adjacent openings from connecting integrally, leading to the mask can not be molded. In the mask as shown in FIG. 8C, it is needed to form a bridge between laterally adjacent openings and longitudinally adjacent openings, to prevent the laterally adjacent openings and longitudinally adjacent openings from connecting integrally, leading to the mask can not be molded. The bridge makes a slight gap formed between the evaporated adjacent sub-pixels, but the slight gap will not affect the display effect of the sub-pixel and the overall resolution.

Similarly, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. In the embodiment, each of the pixels is composed of the two sub-pixels, and when displaying, it need to use the sub-pixel of the adjacent pixel. Thus, based on a minimum mask opening of 40 um, an average width of equivalent RGB pixel of the embodiment is about 46 um, then resolution of the organic light emitting display using the pixel structure according to the embodiment may reach to 550 PPI.

It should be noted that, in the embodiment as shown in FIG. 8, since each of the pixel includes only two color sub-pixels, when displaying, it need to use the sub-pixel of the adjacent pixel. For example, the pixel (1, 1) itself includes the B sub-pixel and the G sub-pixel, and it may use the R sub-pixel of the pixel (1, 2), and it may also use the R sub-pixel of the pixel (2, 1). While the pixel (1, 2) itself includes the R sub-pixel and the G sub-pixel, it may use the B sub-pixel of the pixel (1, 1), and it may also use the B sub-pixel of the pixel (2, 2).

Further, in the embodiment, color arrangement of the sub-pixel of each of the pixels is not limited to the arrangement shown in FIG. 8, wherein the R, G, and B three colors may be changed with one another, as long as the arrangement thereof is consistent with the features disclosed in the figure.

Embodiment 6

Figure 9:
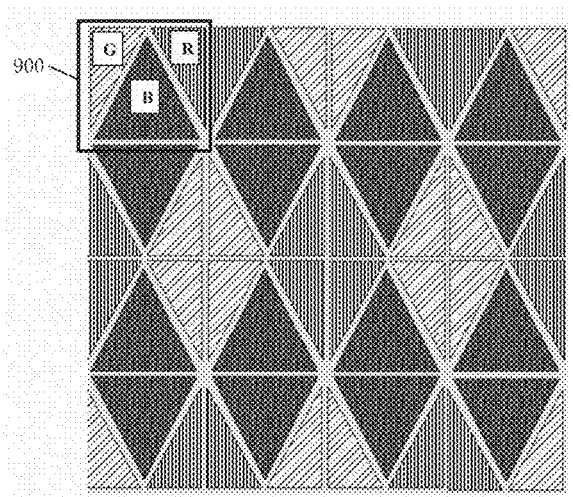
FIG. 9 shows a schematic diagram of the pixel structure of the organic light emitting display according to a sixth embodiment of the present disclosure.

FIG. 9 shows a sixth embodiment of the present disclosure. In the embodiment, the display includes a plurality of pixels 900, each of which is composed of a plurality of sub-pixels. Each of the sub-pixels is a triangle, and each of the pixels is composed of three color sub-pixels. Similarly, in order to share the same opening, in the embodiment the sub-pixels with the same color of the adjacent pixels are arranged together.

In the embodiment as shown in FIG. 9, the pixel is a square on the whole, and the pixel is divided into left, middle and right three regions by a line connecting two ends of one side to a midpoint of a opposite side of the pixel. Wherein, the middle region is an isosceles triangle, and the left region and right region are both right triangles. Wherein, the middle region is a B sub-pixel, and the left region and right region are respectively a G sub-pixel and a R sub-pixel. Thus, the area of the B sub-pixel is twice as much as that of the R sub-pixel or the G sub-pixel, and the position of G and the position of R may be changed with each other.

As shown in FIG. 9, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 9, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In particular, as shown in FIG. 9, the left region of the pixel (1, 1) is the G sub-pixel, the middle region thereof is the B sub-pixel, and the right region thereof is the R sub-pixel; the left region of the pixel (1, 2) is the R sub-pixel, the middle region thereof is the B sub-pixel, and the right region thereof is the G sub-pixel; the left region of the pixel (2, 1) is the R sub-pixel, the middle region thereof is the B sub-pixel, and the right region thereof is the G sub-pixel, and further a vertex direction of the B sub-pixel in the isosceles triangle of the middle region is opposite to the pixel (1, 1); the left region of the pixel (2, 2) is the G sub-pixel, the middle region thereof is the B sub-pixel, and the right region thereof is the R sub-pixel, and further a vertex direction of the B sub-pixel in the isosceles triangle of the middle region is opposite to the pixel (1, 2).

Wherein, each of the pixel units of the embodiment may be composed of longitudinally adjacent odd-numbered (e.g. one) pixels or laterally adjacent odd-numbered (e.g. one) pixels. In this case the pixel unit has following features: (e1) laterally adjacent pixel units are arranged in a horizontal mirror image; (e4) after any one of the pixel units is rotated around a center of the pixel unit by 180 degrees, the arrangement structure thereof is the same with that of the longitudinally adjacent pixel unit; (e5) any one of the pixel units is of the same arrangement structure and in a vertical mirror image with its adjacent pixel unit in the diagonal direction. When the one pixel unit is composed of longitudinally adjacent three or five etc. odd-numbered pixels or laterally adjacent three or five etc. odd-numbered pixels, it also has the above features (e1), (e4), and (e5).

Each of the pixel units may also be composed of laterally adjacent even-numbered (e.g. two) pixels. In this case the pixel unit has following features: (e1) laterally adjacent pixel units are arranged in a horizontal mirror image; (e3) laterally adjacent pixel units are of the same arrangement structure. When the one pixel unit is composed of laterally adjacent four or six etc. even-numbered pixels, it also has the above features (e1) and (e3). Each of the pixel units may also be composed of longitudinally adjacent even-numbered (e.g. two) pixels. In this case the pixel unit has following features: (e1) laterally adjacent pixel units are arranged in a horizontal mirror image; (e2) longitudinally adjacent pixel units are arranged in a vertical mirror image; (e4) after any one of the pixel units is rotated about the center of the pixel unit by 180 degrees, the arrangement structure thereof is the same with that of the longitudinally adjacent pixel unit. When the one pixel unit is composed of longitudinally adjacent four or six etc. even-numbered pixels, it also has the above features (e1), (e2) and (e4).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (e1) laterally adjacent pixel units are arranged in a horizontal mirror image; (e2) longitudinally adjacent pixel units are arranged in a vertical mirror image; (e3) laterally adjacent pixel units are of the same arrangement structure; (e5) the arrangement structure of any one of the pixel units and that of its adjacent pixel unit in the diagonal direction are arranged in a vertical mirror image. When the one pixel is composed of the even-numbered pixels simultaneously located longitudinally adjacent four and six etc. rows, laterally adjacent four and six etc. columns, it also has the above features (e1), (e2), (e3), and (e5).

Further, in the embodiment, color arrangement of the sub-pixel of each of the pixels is not limited to the arrangement shown in FIG. 9, wherein the R, G, and B three colors may be changed with one another, as long as the arrangement thereof is consistent with the features disclosed in the figure.

In the embodiment as shown in FIG. 9, the B sub-pixels of adjacent two pixels are arranged together to form a diamond, and the R sub-pixels and G sub-pixels of the adjacent four pixels are also arranged together to form a diamond. Since the area of the B sub-pixel is twice as much as that of the R sub-pixel or the G sub-pixel, a shape and the area of the region of each color sub-pixel are equal, so that the shape and area of the mask opening for evaporating each color sub-pixel are equal.

Figure 9A:
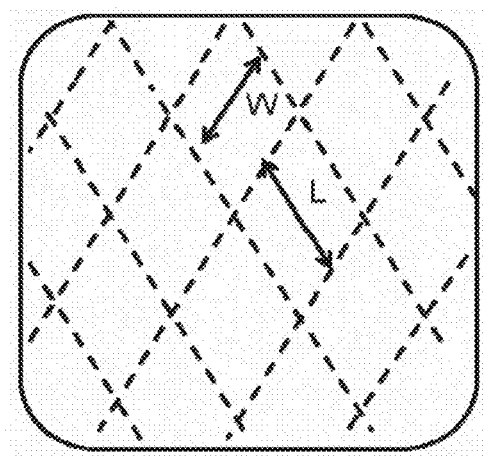
FIG. 9A shows a schematic diagram of one mask opening of the B sub-pixel according to the embodiment as illustrated in FIG. 9.

As shown in FIG. 9A, W is a size of the evaporation mask opening, wherein L is a size of the bridge between the evaporation mask openings.

Figure 9B:
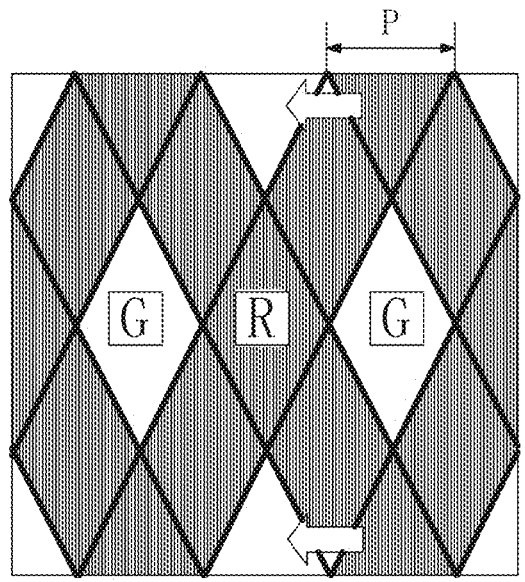
FIG. 9B shows a schematic diagram of one mask opening of the R sub-pixel according to the embodiment as illustrated in FIG. 9.

FIG. 9B is a shape of the mask opening for evaporating the G sub-pixel, and the mask opening of the G sub-pixel is arranged alternately in the mask.

Figure 9C:
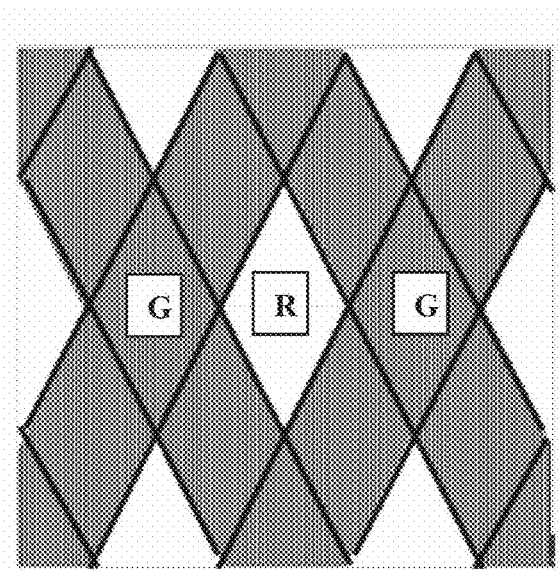
FIG. 9C shows a schematic diagram of one mask opening of the G sub-pixel according to the embodiment as illustrated in FIG. 9.

FIG. 9C is a shape of the mask opening for evaporating the R sub-pixel. The R sub-pixel and the G sub-pixel are repeatedly arranged alternately, and the shape and area of the mask opening of the R sub-pixel are both the same as that of the G sub-pixel, therefore when evaporating the R sub-pixel, the mask for evaporating the G sub-pixel may be translated by a distance P whose size is equal to a distance between two adjacent mask opening, i.e. the distance of one pixel.

Figure 9D:
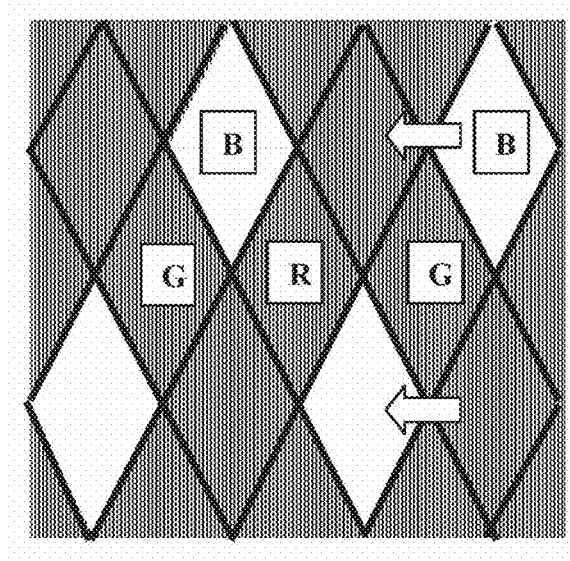
FIG. 9D shows a schematic diagram of a first step of a method for evaporating the B sub-pixel according to the embodiment as illustrated in FIG. 9.
Figure 9E:
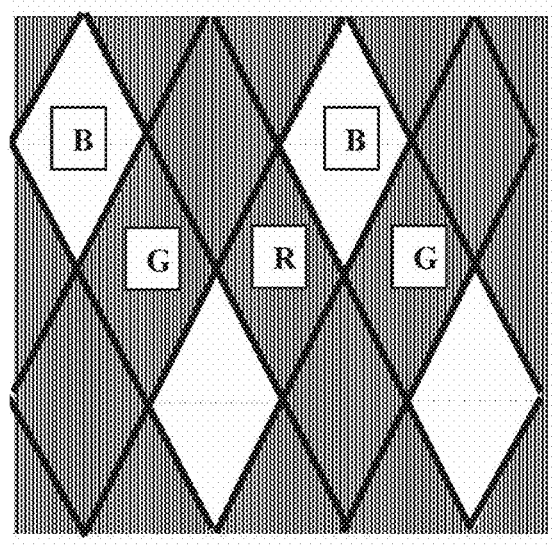
FIG. 9E shows a schematic diagram of a second step of the method for evaporating the B sub-pixel according to the embodiment as illustrated in FIG. 9.

When evaporating the B sub-pixel, it may be divided into two steps, as shown in FIG. 9D, a first step is to evaporate the B sub-pixel alternately, and a second step is to translate the mask by the distance P, then complete the evaporation of the remaining B sub-pixels (as shown in FIG. 9E). In this embodiment, it does not need to preset a gap during evaporating adjacent B sub-pixels. Due to the shape and area of the mask opening for each color sub-pixel is the same, one mask may be shared when evaporating each color sub-pixels. In addition, one mask may not be shared to prevent color mixing.

Similarly, in the embodiment, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. Based on a minimum mask opening of 40 um, using the arrangement as shown in FIG. 9, the size of each of the pixels is at least 40 um, and 1 inch (25400 um) is divided by the size of each of the pixels, then resolution may reach to 25400 um/40 um=635 PPI.

In addition to improving the resolution, the embodiment only need one mask to achieve evaporation of all of the sub-pixels, significantly reducing cost compared with that in prior art three masks are needed to evaporate R, G, and B three sub-pixels respectively. Further, due to the shape and size of the mask of the R, G, and B three color are the same, during evaporation it only need to simply move position repeatedly, thus a process for the evaporation of three colors are the same, reducing the difficulty of the process.

Embodiment 7

Figure 10:
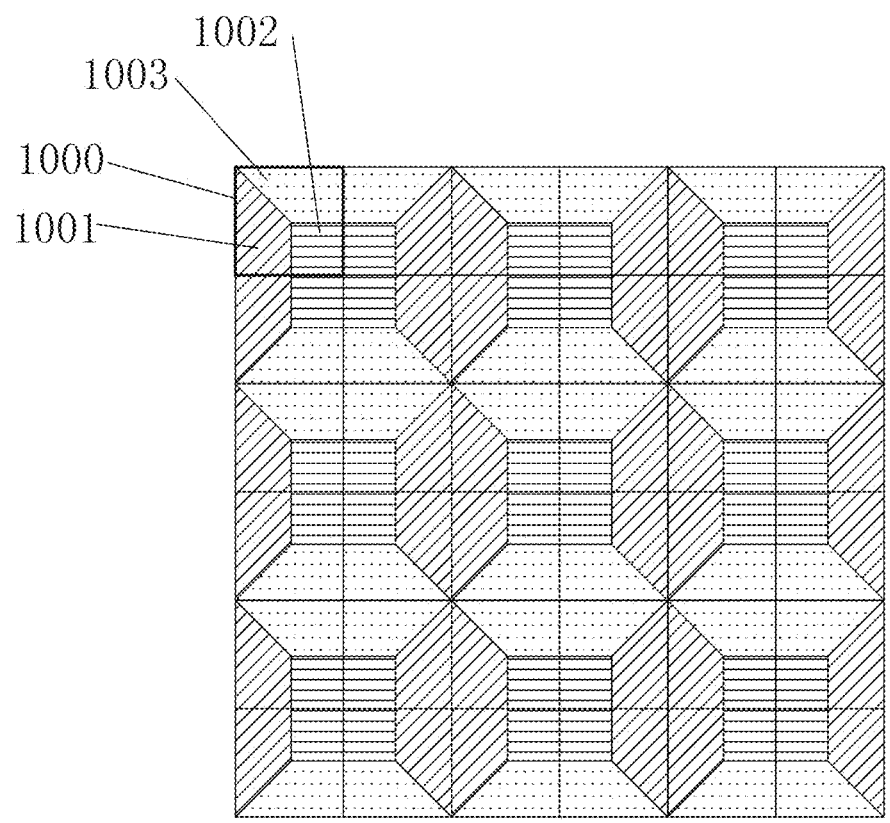
FIG. 10 shows a schematic diagram of the pixel structure of the organic light emitting display according to a seventh embodiment of the present disclosure.

FIG. 10 shows a seventh embodiment of the present disclosure. In the embodiment, the display includes a plurality of pixels 1000, each of which is composed of three sub-pixels. Wherein one sub-pixel is a rectangle, and two other sub-pixels are right angle trapezoid. In order to share the same opening, in the embodiment the sub-pixels with the same color of the adjacent pixels are arranged together.

As shown in FIG. 10, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 10, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

In particular, as shown in FIG. 10, for each of the pixels, the rectangle region is located in one corner of the pixel, and a connection of one corner of the rectangle region to one corner of the pixel in the same direction divides a remaining region of the pixel to two right angle trapezoids. In the pixel (1, 1), the right angle trapezoid is located in an upper region and a left region. In the pixel (1, 2), the right angle trapezoid is located in an upper region and a right region. In the pixel (2, 1), the right angle trapezoid is located in a left region and a lower region. In the pixel (2, 2), the right angle trapezoid is located in a right region and a lower region.

As shown in FIG. 10, the upper region and the left region of the pixel (1, 1) are respective the G sub-pixel 1003 and the R sub-pixel 1001, and the B sub-pixel 1002 is located in the rectangle region of the pixel. The upper region and the right region of the pixel (1, 2) are respective the G sub-pixel and the R sub-pixel, and the B sub-pixel is located in the rectangle region of the pixel. The left region and the lower region of the pixel (2, 1) are respective the R sub-pixel and the G sub-pixel, and the B sub-pixel is located in the rectangle region of the pixel. In the embodiment, the position of the R sub-pixel 1001 and the position of the G sub-pixel 1003 of every pixel may be changed with each other simultaneously.

Wherein, each of the pixel units of the embodiment may be composed of longitudinally adjacent odd-numbered (e.g. one) pixels or laterally adjacent odd-numbered (e.g. one) pixels. In this case the pixel unit has following features: (f1) laterally adjacent pixel units are arranged in a horizontal mirror image; (f2) longitudinally adjacent pixel units are arranged in a vertical mirror image; (f9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent three or five etc. odd-numbered pixels or laterally adjacent three or five etc. odd-numbered pixels, it also has the above features (f1), (f2), and (f9).

Each of the pixel units may also be composed of laterally adjacent even-numbered (e.g. two) pixels. In this case the pixel unit has following features: (f1) laterally adjacent pixel units are arranged in a horizontal mirror image; (f2) longitudinally adjacent pixel units are arranged in a vertical mirror image; (f3) laterally adjacent pixel units are of the same arrangement structure; (f5) after any one of the pixel units is rotated around a center of the pixel unit by 180 degrees, the arrangement structure thereof is the same with that of the longitudinally adjacent pixel unit; (f7) any one of the pixel units and its adjacent pixel unit in the diagonal direction are arranged in a vertical mirror image; (f9) after any one of the pixel units is rotated around a center of the pixel unit by 180 degrees, the arrangement structure thereof is the same with that of the adjacent pixel unit in the diagonal thereof. When the one pixel unit is composed of laterally adjacent four or six etc. even-numbered pixels, it also has the above features (f1), (f2), (f3), (f5), (f7) and (f9).

Each of the pixel units may also be composed of longitudinally adjacent even-numbered (e.g. two) pixels. In this case the pixel unit has following features: (f1) laterally adjacent pixel units are arranged in a horizontal mirror image; (f2) longitudinally adjacent pixel units are arranged in a vertical mirror image; (f4) longitudinally adjacent pixel units are of the same arrangement structure; (f6) after any one of the pixel units is rotated by 180 degrees, the arrangement structure thereof is the same with that of the laterally adjacent pixel unit; (f8) any one of the pixel units and its adjacent pixel unit in the diagonal direction are arranged in a horizontal mirror image; (f9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent four or six etc. even-numbered pixels, it also has the above features (f1), (f2), (f4), (f6), (f8) and (f9).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (f1) laterally adjacent pixel units are arranged in a horizontal mirror image; (f2) longitudinally adjacent pixel units are arranged in a vertical mirror image; (f3) laterally adjacent pixel units are of the same arrangement structure; (f4) longitudinally adjacent pixel units are of the same arrangement structure; (f5) after any one of the pixel units is rotated around a center of the pixel unit by 180 degrees, the arrangement structure thereof is the same with that of the longitudinally adjacent pixel unit; (f6) any one of the pixel units is rotated by 180 degrees, the arrangement structure thereof is the same with that of the laterally adjacent pixel unit; (f7) any one of the pixel units and its adjacent pixel unit in the diagonal direction are arranged in a vertical mirror image; (f8) any one of the pixel units and its adjacent pixel unit in the diagonal direction are arranged in a horizontal mirror image; (f9) after any one of the pixel units is rotated around a center of the pixel unit by 180 degrees, the arrangement structure thereof is the same with that of the adjacent pixel unit in the diagonal thereof. When the one pixel is composed of the even-numbered pixels simultaneously located longitudinally adjacent four and six etc. rows, laterally adjacent four and six etc. columns, it also has the above features (f1), (f2), (f3), (f4), (f5), (f6), (f7), (f8) and (f9).

Further, in the embodiment, color arrangement of the sub-pixel of each of the pixels is not limited to the arrangement shown in FIG. 10, wherein the R, G, and B three colors may be changed with one another, as long as the arrangement thereof is consistent with the features disclosed in the figure.

Figure 10A:
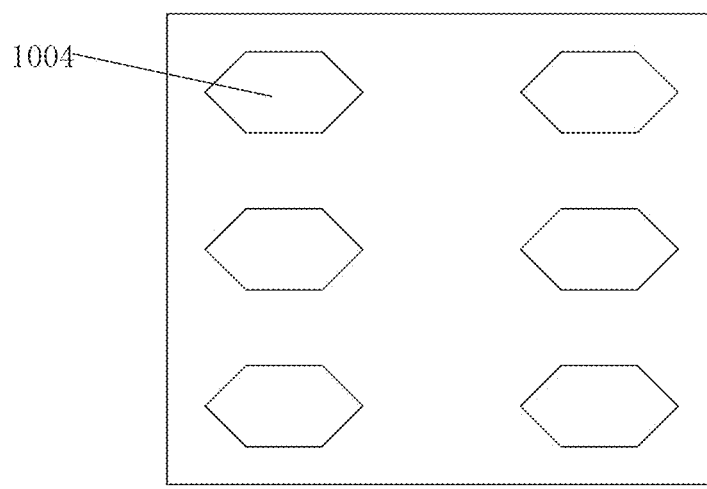
FIG. 10A shows a schematic diagram of one mask opening of the R or G sub-pixel according to the embodiment as illustrated in FIG. 10.

FIG. 10A shows a schematic diagram of one mask opening of the G sub-pixel according to the present embodiment illustrated in FIG. 10. In the embodiment, a mask opening 1004 is a hexagon, and the G sub-pixels of four adjacent pixels may be evaporated through one opening at the same time. After one part of the G sub-pixels are evaporated, translating the mask by two pixel distances, to evaporate the remaining G sub-pixels. The mask may be used to evaporate the R sub-pixel after being rotated by 90 degrees.

Figure 10B:
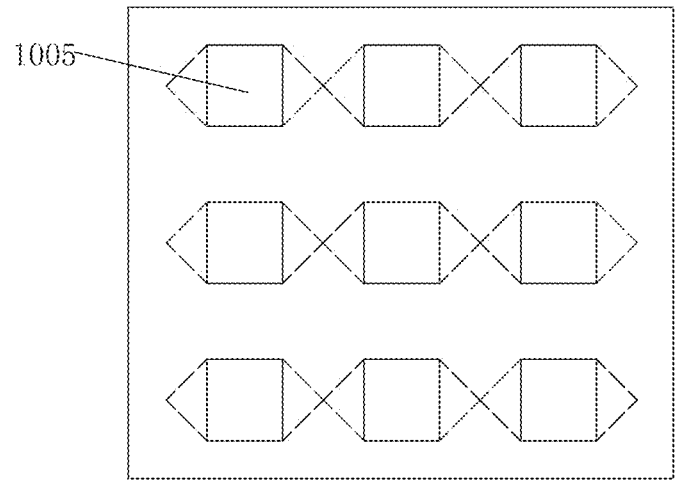
FIG. 10B shows a schematic diagram of another mask opening of the R or G sub-pixel according to the embodiment as illustrated in FIG. 10.
Figure 10C:
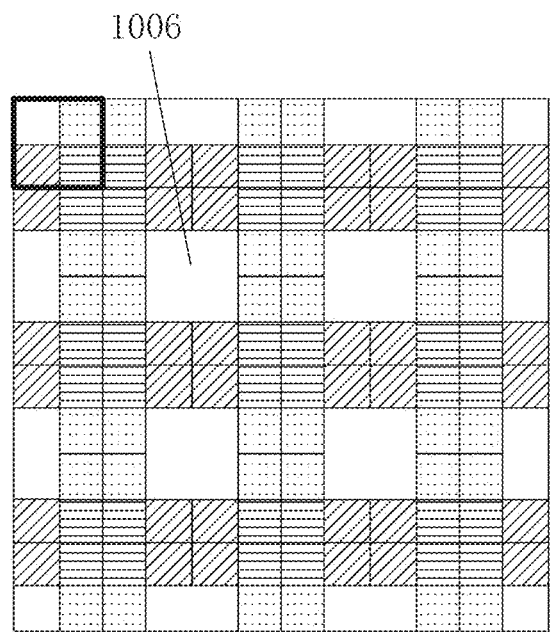
FIG. 10C shows a schematic diagram of the pixel structure evaporated by the mask of FIG. 10B.

Further, the mask as shown in FIG. 10B may also be used, whose opening 1005 is square. According to a dotted line marked in the figure, it can be seen that a triangular portion on two sides of a hexagon is removed from the opening, and therefore, the R sub-pixel, the G sub-pixel and the B sub-pixel may be evaporated using the same mask. It should be noted that, the shape of the R sub-pixel and the G sub-pixel evaporated through the mask is actually a rectangle, as shown in FIG. 10C, forming a rectangular region 1006 which does not emit light between the pixels. Of course, the rectangular region 1006 may also be evaporated as the W sub-pixel.

Similarly, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. In the embodiment, a width of each of the pixels is equal to that of a mask opening for evaporating the B sub-pixel. Based on a minimum mask opening of 40 um obtained by modern techniques, the size of each of the pixels is about 40 um, then resolution of the organic light emitting display using the pixel structure according to the embodiment may reach to 635 PPI.

Figure 11:
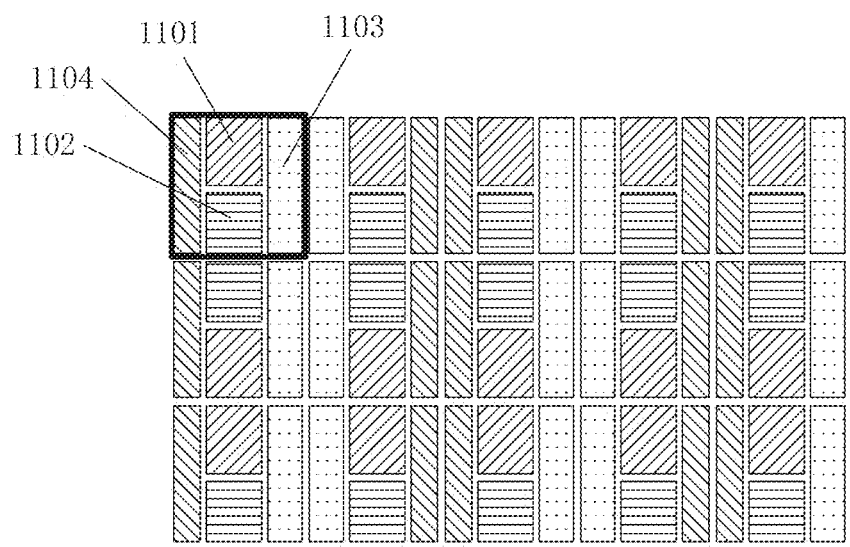
FIG. 11 shows a schematic diagram of the pixel structure of the organic light emitting display according to an eighth embodiment of the present disclosure.
Figure 12:
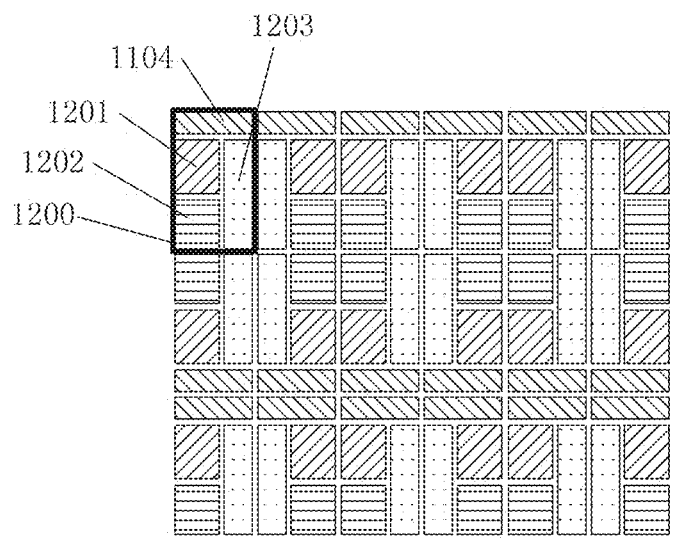
FIG. 12 shows a schematic diagram of the pixel structure of the organic light emitting display according to a ninth embodiment of the present disclosure.

FIG. 11 and FIG. 12 show respectively the eighth embodiment and ninth embodiment according to the present disclosure. In the two embodiments, the display respectively includes a plurality of pixels 1100, each of which is composed of four sub-pixels, and each of the sub-pixels is rectangle. The two embodiments are added a W sub-pixel based on the embodiment as shown in FIG. 3, and positions of the W sub-pixels in the two embodiments are different.

Similarly, in order to share the same opening, in the embodiment the sub-pixels with the same color of the adjacent pixels are arranged together.

Embodiment 8

As shown in FIG. 11, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 11, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

As shown in FIG. 11, in the pixel (1, 1) 1100, a W sub-pixel 1104 is on the left of the pixel, a B sub-pixel 1102 is on the right of the pixel, a R sub-pixel 1101 a G sub-pixel 1103 are between the W sub-pixel 1104 and the B sub-pixel 1102, and the R sub-pixel 1101 is on a upper side, and the G sub-pixel 1103 is on the lower side; In the pixel (1, 2), the B sub-pixel is on the left of the pixel, the W sub-pixel is on the right of the pixel, the R sub-pixel the G sub-pixel are between the W sub-pixel and the B sub-pixel, and the R sub-pixel is on a upper side, and G sub-pixel is on the lower side; In the pixel (2, 1), the W sub-pixel is on the left of the pixel, the B sub-pixel is on the right of the pixel, the R sub-pixel the G sub-pixel are between the W sub-pixel and the B sub-pixel, and the G sub-pixel is on a upper side, and B sub-pixel is on the lower side.

In each of the pixels, the position of the R sub-pixel 1101 and the position of the G sub-pixel 1103 may be changed with each other simultaneously; the position of the W sub-pixel 1104 and the position of the B sub-pixel 1102 also may be changed with each other simultaneously.

Wherein, each of the pixel units of the embodiment may be composed of longitudinally adjacent odd-numbered (e.g. one) pixels or laterally adjacent odd-numbered (e.g. one) pixels. In this case the pixel unit has following features: (g1) laterally adjacent pixel units are arranged in a horizontal mirror image; (g2) longitudinally adjacent pixel units are arranged in a vertical mirror image; (g9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent three or five etc. odd-numbered pixels or laterally adjacent three or five etc. odd-numbered pixels, it also has the above features (g1), (g2) and (g9).

Each of the pixel units may also be composed of laterally adjacent even-numbered (e.g. two) pixels. In this case the pixel unit has following features: (g1) laterally adjacent pixel units are arranged in a horizontal mirror image; (g2) longitudinally adjacent pixel units are arranged in a vertical mirror image; (g3) vertical adjacent pixel units are of the same arrangement structure; (g5) any one of the pixel units is rotated around a center of the pixel unit by 180 degrees, the arrangement structure thereof is the same with that of the longitudinally adjacent pixel unit; (g7) any one of the pixel units and its adjacent pixel unit in the diagonal direction are arranged in a vertical mirror image; (g9) after any one of the pixel units is rotated around a center of the pixel unit by 180 degrees, the arrangement structure thereof is the same with that of the adjacent pixel unit in the diagonal thereof. When the one pixel unit is composed of laterally adjacent four or six etc. even-numbered pixels, it also has the above features (g1), (g2), (g3), (g5), (g7) and (g9).

Each of the pixel units may also be composed of longitudinally adjacent even-numbered (e.g. two) pixels. In this case the pixel unit has following features: (g1) laterally adjacent pixel units are arranged in a horizontal mirror image; (g2) longitudinally adjacent pixel units are arranged in a vertical mirror image; (g4) longitudinally adjacent pixel units are of the same arrangement structure; (g6) after any one of the pixel units is rotated by 180 degrees, the arrangement structure thereof is the same with that of the laterally adjacent pixel unit; (g8) any one of the pixel units and its adjacent pixel unit in the diagonal direction are arranged in a horizontal mirror image; (g9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent four or six etc. even-numbered pixels, it also has the above features (g1), (g2), (g4), (g6), (g8) and (g9).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (g1) laterally adjacent pixel units are arranged in a horizontal mirror image; (g2) longitudinally adjacent pixel units are arranged in a vertical mirror image; (g3) laterally adjacent pixel units are of the same arrangement structure; (g4) longitudinally adjacent pixel units are of the same arrangement structure; (g5) after any one of the pixel units is rotated around a center of the pixel unit by 180 degrees, the arrangement structure thereof is the same with that of the longitudinally adjacent pixel unit; (g6) after any one of the pixel units is rotated by 180 degrees, the arrangement structure thereof is the same with that of the laterally adjacent pixel unit; (g7) any one of the pixel units and its adjacent pixel unit in the diagonal direction are arranged in a vertical mirror image; (g8) any one of the pixel units and its adjacent pixel unit in the diagonal direction are arranged in a horizontal mirror image; (g9) after any one of the pixel units is rotated around a center of the pixel unit by 180 degrees, the arrangement structure thereof is the same with that of the adjacent pixel unit in the diagonal thereof. When the one pixel is composed of the even-numbered pixels simultaneously located longitudinally adjacent four and six etc. rows, laterally adjacent four and six etc. columns, it also has the above features (g1), (g2), (g3), (g4), (g5), (g6), (g7), (g8) and (g9).

Further, in the embodiment, color arrangement of the sub-pixel of each of the pixels is not limited to the arrangement shown in FIG. 11, wherein the R, G, B, and W four colors may be changed with one another, as long as the arrangement thereof is consistent with the features disclosed in the figure.

Similarly, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. In the embodiment, a width of each of the pixels is twice as much as that of a mask opening. Based on a minimum mask opening of 40 um obtained by modern techniques, the size of each of the pixels is about 80 um, then resolution of the organic light emitting display using the pixel structure according to the embodiment may reach to 317 PPI.

Embodiment 9

As shown in FIG. 12, this figure shows only a part of the organic light emitting display, and number of the pixels of an actual product is not limited to this. The first row, the second row, the first column, and the second column and so on described in the present disclosure are to illustrate the present disclosure with reference to the drawings, and it does not refer to the row and column of the actual product. As shown in FIG. 12, the pixel in the first row and in the first column is denoted as pixel (1, 1), the pixel in the first row and in the second column is denoted as pixel (1, 2), the pixel in the second row and in the first column is denoted as pixel (2, 1), and the pixel in the second row and in the second column is denoted as pixel (2, 2), and so on.

As shown in FIG. 12, in the pixel (1, 1) 1200, a W sub-pixel 1204 is on an upper portion of the pixel, a R sub-pixel 1201, a G sub-pixel 1203 and a B sub-pixel 1202 are arranged as illustrated and located in the lower side of the W sub-pixel 1204, wherein the B sub-pixel 1202 is on the right, the R sub-pixel 1201 and the G sub-pixel 1203 are both on the left and the R sub-pixel is on the upper side and the G sub-pixel is on the lower side; in the pixel (1, 2), the W sub-pixel is on the upper portion of the pixel, the R sub-pixel, the G sub-pixel and the B sub-pixel are arranged as illustrated and located in the lower side of the W sub-pixel, wherein the B sub-pixel is on the left, the R sub-pixel and the G sub-pixel are both on the right and the R sub-pixel is on the upper side and the G sub-pixel is on the lower side; in the pixel (2, 1), the W sub-pixel is on the lower portion of the pixel, the R sub-pixel, the G sub-pixel and the B sub-pixel are arranged as illustrated and located in the upper side of the W sub-pixel, wherein the B sub-pixel is on the right, the R sub-pixel and the G sub-pixel are both on the left and the G sub-pixel is on the upper side and the R sub-pixel is on the lower side.

In each of the pixels, the position of the R sub-pixel 1201 and the position of G sub-pixel 1203 may be changed with each other simultaneously; the position of the W sub-pixel 1204 and the position of B sub-pixel 1202 also may be changed with each other simultaneously.

Wherein, each of the pixel units of the embodiment may be composed of longitudinally adjacent odd-numbered (e.g. one) pixels or laterally adjacent odd-numbered (e.g. one) pixels. In this case the pixel unit has following features: (h1) laterally adjacent pixel units are arranged in a horizontal mirror image; (h2) longitudinally adjacent pixel units are arranged in a vertical mirror image; (h9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent three or five etc. odd-numbered pixels or laterally adjacent three or five etc. odd-numbered pixels, it also has the above features (h1), (h2) and (h9).

Each of the pixel units may also be composed of laterally adjacent even-numbered (e.g. two) pixels. In this case the pixel unit has following features: (h1) laterally adjacent pixel units are arranged in a horizontal mirror image; (h2) longitudinally adjacent pixel units are arranged in a vertical mirror image; (h3) laterally adjacent pixel units are of the same arrangement structure; (h5) after any one of the pixel units is rotated around a center of the pixel unit by 180 degrees, the arrangement structure thereof is the same with that of the longitudinally adjacent pixel unit; (h7) any one of the pixel units and its adjacent pixel unit in the diagonal direction are arranged in a vertical mirror image; (h9) after any one of the pixel units is rotated around a center of the pixel unit by 180 degrees, the arrangement structure thereof is the same with that of the adjacent pixel unit in the diagonal thereof. When the one pixel unit is composed of laterally adjacent four or six etc. even-numbered pixels, it also has the above features (h1), (h2), (h3), (h5), (h7) and (h9).

Each of the pixel units may also be composed of longitudinally adjacent even-numbered (e.g. two) pixels. In this case the pixel unit has following features: (h1) laterally adjacent pixel units are arranged in a horizontal mirror image; (h2) longitudinally adjacent pixel units are arranged in a vertical mirror image; (h4) longitudinally adjacent pixel units are of the same arrangement structure; (h6) after any one of the pixel units is rotated by 180 degrees, the arrangement structure thereof is the same with that of the laterally adjacent pixel unit; (h8) any one of the pixel units and its adjacent pixel unit in the diagonal direction are arranged in a horizontal mirror image; (h9) after any one of the pixel units is rotated around a center of the pixel unit by 180 degrees, the arrangement structure thereof is the same with that of the adjacent pixel unit in the diagonal thereof. When the one pixel unit is composed of longitudinally adjacent four or six etc. even-numbered pixels, it also has the above features (h1), (h2), (h4), (h6), (h8) and (h9).

Each of the pixel units may also be composed of even-numbered pixels simultaneously located in longitudinally adjacent row and laterally adjacent column (such as four pixels located in longitudinally adjacent two rows and laterally adjacent two columns). In this case the pixel unit has following features: (h1) laterally adjacent pixel units are arranged in a horizontal mirror image; (h2) longitudinally adjacent pixel units are arranged in a vertical mirror image; (h3) laterally adjacent pixel units are of the same arrangement structure; (h4) longitudinally adjacent pixel units are of the same arrangement structure; (h5) after any one of the pixel units is rotated around a center of the pixel unit by 180 degrees, the arrangement structure thereof is the same with that of the longitudinally adjacent pixel unit; (h6) after any one of the pixel units is rotated by 180 degrees, the arrangement structure thereof is the same with that of the laterally adjacent pixel unit; (h7) any one of the pixel units and its adjacent pixel unit in the diagonal direction are arranged in a vertical mirror image; (h8) any one of the pixel units and its adjacent pixel unit in the diagonal direction are arranged in a horizontal mirror image; (h9) after any one of the pixel units is rotated around a center of the pixel unit by 180 degrees, the arrangement structure thereof is the same with that of the adjacent pixel unit in the diagonal thereof. When the one pixel is composed of the even-numbered pixels simultaneously located in longitudinally adjacent four and six etc. rows, laterally adjacent four and six etc. columns, it also has the above features (h1), (h2), (h3), (h4), (h5), (h6), (h7), (h8) and (h9).

Further, in the embodiment, color arrangement of the sub-pixel of each of the pixels is not limited to the arrangement shown in FIG. 12, wherein the R, G, B, and W four colors may be changed with one another, as long as the arrangement thereof is consistent with the features disclosed in the figure.

Similarly, the sub-pixels with the same color in adjacent rows and/or adjacent columns are arranged together, thereby the sub-pixels may share one mask opening during evaporation, that is, a plurality of sub-pixels may be evaporated through one mask opening. Therefore, more sub-pixels may be evaporated when the size of the mask opening is set, improving pixel density, i.e. improving the resolution of the organic light emitting display. In the embodiment, a width of each of the pixels is twice as much as that of a mask opening. Based on a minimum mask opening of 40 um obtained by modern techniques, the size of each of the pixels is about 80 um, then resolution of the organic light emitting display using the pixel structure according to the embodiment may reach to 317 PPI.

The embodiments described above are merely the expression of several embodiments of the present disclosure, and the description is more specific and detailed, but it should be understood that the embodiments does not limit the scope of the present disclosure. It should be noted that a person skilled in the art may make several modifications and improvements without departing from the principle of the present disclosure, which belong to the scope of the present disclosure. Accordingly, the scope of the present disclosure shall be subject to the appended claims.

The invention claimed is:

1. A pixel structure, comprising a plurality of pixels with each pixel comprising:
   a plurality of sub-pixels forming at least one pixel, and each sub-pixel having a color selected from a group consisting of red (R), blue (B), and green (G),
   the at least one pixel forms a pixel unit,
   a longitudinally adjacent and a laterally adjacent pixels are arranged in a first mirror image, and a second mirror image, wherein each pixel is the first mirror image of a subsequent pixel in a longitudinal direction and each pixel is the second mirror image of the subsequent pixel in a lateral direction, wherein the first and second mirror images are different, and
   wherein a same color of the sub-pixels are arranged together both in the longitudinally adjacent and laterally adjacent pixels, and each pixel has a different arrangement of the sub-pixels from both longitudinally adjacent and laterally adjacent pixels thereof, and
   wherein each pixel has a square shape, and a first sub-pixel, a second sub-pixel, and a third sub-pixel of the plurality of sub-pixels,
   wherein the first sub-pixel and the second sub-pixel have a same right-angled trapezoidal shape, and the third sub-pixel has a square shape,
   wherein the first sub-pixel and the second sub-pixel have the same right-angled trapezoidal shape with a short upper side, a long lower side parallel to the upper side, and a inclined side with regard to the upper side and the lower side, and
   wherein the first sub-pixel and the second sub-pixel share the same inclined side, and the third sub-pixel shares two adjacent sides with the upper sides of the first and second sub-pixels.

2. The pixel structure according to claim 1, wherein the arrangement structure of any one of the pixel units remains unchanged after the pixel unit is rotated around a center of the pixel unit by 180 degrees; or the arrangement structure of any one of the pixel units is the same with that of the longitudinally adjacent and/or laterally adjacent pixel unit after the pixel unit is rotated around a center of the pixel unit by 180 degrees.

3. The pixel structure according to claim 1, wherein the pixel includes an R sub-pixel, a G sub-pixel and a B sub-pixel.

4. An organic light emitting display including the pixel structure according to claim 1.

* * * * *